(12) United States Patent
Kiuchi et al.

(10) Patent No.: US 11,978,993 B2
(45) Date of Patent: May 7, 2024

(54) CONNECTOR CABLE THAT PREVENTS BOTH INCREASE IN IMPEDANCE AND A SHORT CIRCUIT IN A CONNECTOR CABLE THAT CONNECTS A CONNECTOR AND A SHIELDED CABLE VIA A RELAY SUBSTRATE

(71) Applicant: Japan Aviation Electronics Industry, Limited, Tokyo (JP)

(72) Inventors: Hideki Kiuchi, Tokyo (JP); Yoshihide Kuroki, Tokyo (JP); Yukitaka Tanaka, Tokyo (JP); Takashi Nemoto, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 156 days.

(21) Appl. No.: 17/668,518

(22) Filed: Feb. 10, 2022

(65) Prior Publication Data
US 2022/0368041 A1   Nov. 17, 2022

(30) Foreign Application Priority Data

May 13, 2021   (JP) .................................. 2021-081890

(51) Int. Cl.
*H01R 9/05* (2006.01)
*H01R 12/57* (2011.01)
(Continued)

(52) U.S. Cl.
CPC ........... *H01R 9/0515* (2013.01); *H01R 12/57* (2013.01); *H01R 13/502* (2013.01); *H01R 13/6592* (2013.01)

(58) Field of Classification Search
CPC .... H01R 9/0515; H01R 12/57; H01R 13/502; H01R 13/6592
(Continued)

(56) References Cited

U.S. PATENT DOCUMENTS

| 5,679,008 A | 10/1997 | Takahashi et al. |
| 7,651,379 B1 * | 1/2010 | Wu ...................... H01R 13/514 |
| | | 439/497 |

(Continued)

FOREIGN PATENT DOCUMENTS

| EP | 2519086 B1 * | 3/2016 | ......... H01R 13/6461 |
| JP | H08-167457 A | 6/1996 | |

(Continued)

OTHER PUBLICATIONS

European Patent Office, "Extended European Search Report with Search Opinion for European Patent Application No. 22164574.0," dated Sep. 13, 2022.

(Continued)

*Primary Examiner* — Peter G Leigh
(74) *Attorney, Agent, or Firm* — Manabu Kanesaka

(57) ABSTRACT

To prevent both increase in impedance and a short circuit, a connector cable is configured such that a connector and a shielded cable are connected via a relay substrate. The shielded cable includes at least an inner conductor, a dielectric covering the inner conductor, and a shield member covering the dielectric. The inner conductor is connected to a contact of the connector at a part where the shield member and the dielectric are removed to expose the inner conductor. At least directly under a part where the shield member is removed to expose the dielectric, a ground (GND) conductor layer on a front surface of the relay substrate is arranged. The GND conductor layer on the front surface of the relay substrate, which is arranged directly under the part where the shield member is removed, is covered with an insulating member.

11 Claims, 30 Drawing Sheets

(51) Int. Cl.
*H01R 13/502* (2006.01)
*H01R 13/6592* (2011.01)

(58) Field of Classification Search
USPC .......................................................... 439/63
See application file for complete search history.

(56) References Cited

U.S. PATENT DOCUMENTS

| | | | |
|---|---|---|---|
| 9,401,573 B1* | 7/2016 | Fernandez | H01R 24/62 |
| 10,312,566 B2* | 6/2019 | Yamada | A61B 8/12 |
| 2009/0120682 A1* | 5/2009 | Ohtsuji | H01R 13/6658 |
| | | | 174/359 |
| 2016/0268745 A1* | 9/2016 | Little | H01R 13/6273 |
| 2016/0372848 A1* | 12/2016 | Yamada | H01P 5/08 |
| 2020/0119496 A1* | 4/2020 | Zhang | H01R 13/5808 |

FOREIGN PATENT DOCUMENTS

| | | | | |
|---|---|---|---|---|
| JP | 2016163769 A | * | 9/2016 | |
| WO | WO-2007004773 A1 | * | 1/2007 | ........... H01R 12/598 |
| WO | 2018/229152 A1 | | 12/2018 | |

OTHER PUBLICATIONS

1 European Patent Office, "Office Action for European Patent Application No. 22164574.0," dated Jul. 17, 2023.

* cited by examiner

Prior Art

Prior Art

Prior Art

Prior Art

CONNECTOR CABLE THAT PREVENTS BOTH INCREASE IN IMPEDANCE AND A SHORT CIRCUIT IN A CONNECTOR CABLE THAT CONNECTS A CONNECTOR AND A SHIELDED CABLE VIA A RELAY SUBSTRATE

RELATED APPLICATIONS

The present application is based on and claims priority from, Japanese Patent Applications No. 2021-081890 filed May 13, 2021, the disclosure of which is hereby incorporated by reference herein in its entirety.

BACKGROUND OF THE INVENTION

Field of the Invention

The present invention relates to a connector cable.

Description of the Related Art

Conventionally, a connector cable in which a connector and a shielded cable are connected via a relay substrate is known. For example, Japanese Patent Laid-Open No. 8-167457 discloses a conventional example of a high-speed connector cable in which contacts (3) of electric connectors (1) are connected to coaxial cables (5) via relay substrates (4), as shown in FIGS. 27 to 30. In the high-speed connector cable disclosed in Japanese Patent Laid-Open No. 8-167457, the coaxial cable (5) is impedance-matched by a core wire (51), an intermediate insulator (52), and a braided shield (53), and the relay substrate (4) is impedance-matched by signal patterns (43) on a front surface, and ground patterns on a front surface side (44) and ground patterns on a back surface side (45) that is the other side across an insulating portion (42).

Note that the reference numerals related to the description of the prior art document are distinguished from the embodiments of the present invention by adding parentheses.

However, a part where the braided shield (53) of the coaxial cable (5) is removed to expose the core wire (51) and the intermediate insulator (52) (see FIG. 30) is far from both the ground pattern on the front surface side (44) and the ground pattern on the back surface side (45). Therefore, this part has increase in impedance. Then, a countermeasure to reduce the increase in impedance might be removing the braided shield (53) to expose the core wire (51) and the intermediate insulator (52), and extending the ground pattern on the front surface side (44) to directly under the exposed part. However, this countermeasure would have difficulty in extending the ground pattern on the front surface side (44) because the extended ground pattern on the front surface side (44) may be short-circuited with the core wire (51) soldered to the adjacent signal pattern (43). In other words, the prior art represented by the high-speed connector cable disclosed in Japanese Patent Laid-Open No. 8-167457 has a problem in which the art cannot prevent both increase in impedance and a short circuit in the part where the braided shield (53: shield member) of the coaxial cable (5: shielded cable) is removed to expose the core wire (51: inner conductor) and the intermediate insulator (52: dielectric).

Therefore, it is an object of the present invention to provide a connector cable that prevents both increase in impedance and a short circuit in a connector cable that connects a connector and a shielded cable via a relay substrate.

SUMMARY OF THE INVENTION

A connector cable of the present invention is a connector cable including a connector, a shielded cable, and a relay substrate, the connector and the shielded cable being connected via the relay substrate, wherein: the shielded cable includes at least an inner conductor, a dielectric covering the inner conductor, and a shield member covering the dielectric; the inner conductor is connected to a contact of the connector at a part where the shield member and the dielectric are removed to expose the inner conductor; at least directly under a part where the shield member is removed to expose the dielectric, a ground (GND) conductor layer on a front surface of the relay substrate is arranged; and the GND conductor layer on the front surface of the relay substrate, which is arranged directly under the part where the shield member is removed, is covered with an insulating member.

In other words, the connector cable of the present invention has the insulating member and the GND conductor layer on the front surface of the relay substrate directly under the part where the shield member of the shielded cable is removed. This effectively prevents increase in impedance. In addition, in the connector cable of the present invention, the contact of the connector is directly connected to the inner conductor of the shielded cable. Therefore, the present invention does not need process of bending (forming) the inner conductor to the front surface of the substrate. Further, the GND conductor layer on the front surface of the wiring substrate, arranged directly under the part where the shield member is removed, is not adjacent to the inner conductor of the shielded cable. Specifically, the GND conductor layer is separated from the inner conductor in the vertical direction, and an insulating member is interposed between them, so that it is hard to short-circuit.

Further, the connector cable of the present invention may be configured such that the insulating member is a resist coated to the front surface of the GND conductor layer.

Further, the connector cable of the present invention may be configured such that: a connection part between the contact of the connector and the exposed inner conductor of the shielded cable is connected by soldering; the GND conductor layer on the front surface of the relay substrate is extended to directly under the contact of the connector and the connection part; and the GND conductor layer directly under the connection part is cut out.

Further, the connector cable of the present invention may be configured such that: the connection part between the contact of the connector and the exposed inner conductor of the shielded cable is connected by soldering; and the relay substrate is cut out at a part directly under the contact of the connector and the exposed inner conductor of the shielded cable.

Further, the connector cable of the present invention may be configured such that: the contact of the connector is held in an insulation connector mold; the connection part between the contact of the connector and the exposed inner conductor of the shielded cable is connected by soldering; and the connector mold extends to directly under the contact of the connector and the connection part.

In other words, the connector cable of the present invention has the connection part between the contact of the connector and the exposed inner conductor of the shielded cable. At the connection part, the impedance decreases locally due to soldering. However, the present invention has a configuration in which the part directly under the connection part does not have the GND conductor layer, which allows the local decrease in impedance to be smaller. This leads to an advantage of better impedance matching.

Further, the connector cable of the present invention may be configured such that: one or more unshielded cables are connected to the connector; and at least one of the unshielded cables is connected to the contact of the connector via a conductor of the relay substrate.

Further, the connector cable of the present invention may be configured such that: the relay substrate also has a GND conductor layer on a back surface side; and the contact of the connector, the shielded cable, and the GND conductor layer are arranged so as to be mirror image symmetric with the front surface side.

Advantageous Effect of Invention

According to the present invention, there can be provided a connector cable that prevents both increase in impedance and a short circuit in a connector cable that connects a connector and a shielded cable via a relay substrate.

DETAILED DESCRIPTION OF THE PREFERRED EMBODIMENTS

The following describes suitable embodiments for carrying out the present invention with reference to drawings. Note that: the following embodiments do not limit the invention according to each claim; and not all combinations of characteristics described in the embodiments are essential to the solution of the invention.

First Embodiment

The following describes a first embodiment, which is one possible embodiment of a connector cable of the present invention with reference to FIGS. 1 to 5.

As shown in FIGS. 1 to 5, a connector cable 100 of the first embodiment includes a connector 10, a shielded cable 20, and a relay substrate 30. The connector cable 100 has a configuration in which the connector 10 and the shielded cable 20 are connected via the relay substrate 30.

Figure 1:
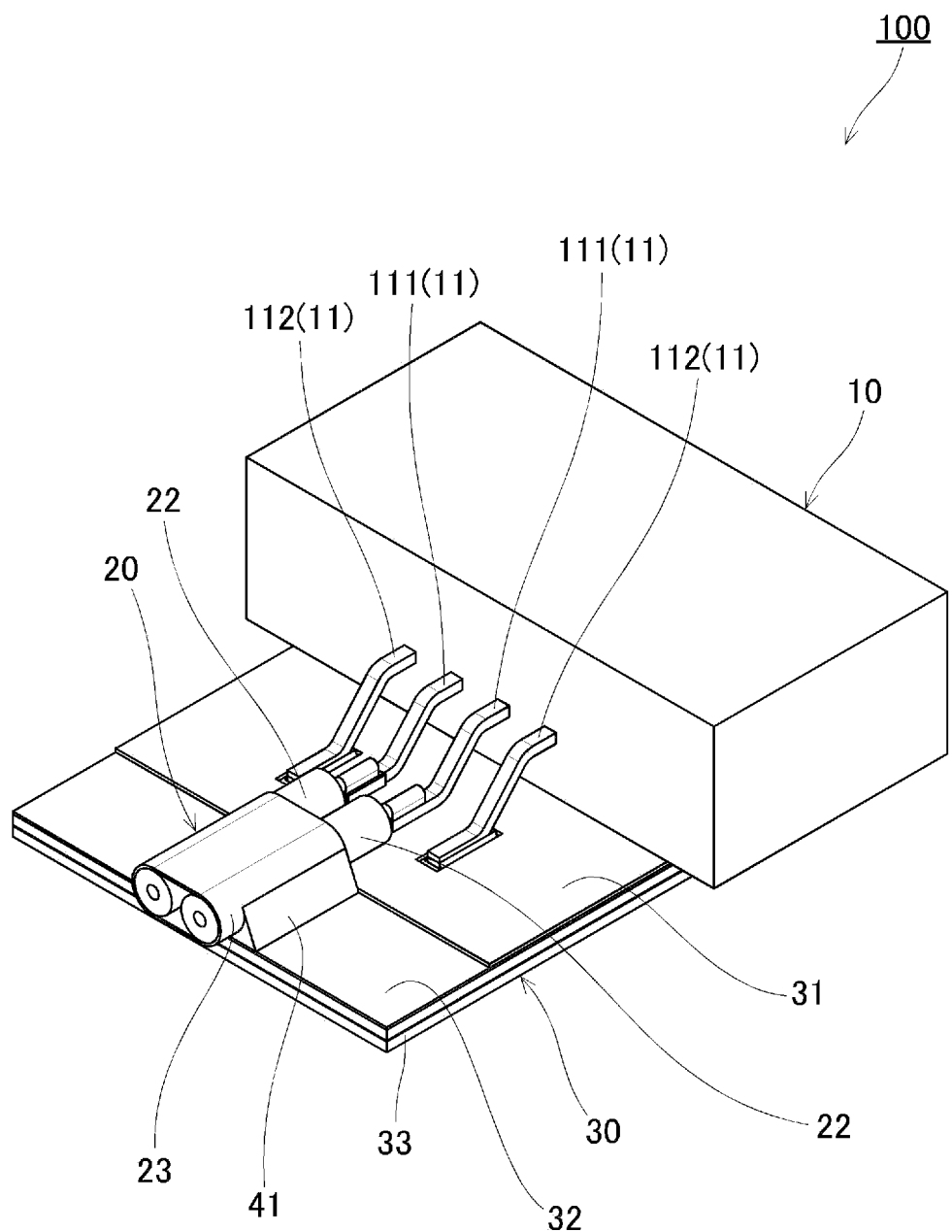
FIG. 1 is a perspective view of a connector cable of a first embodiment as viewed from the upper left side of a rear surface.
Figure 2:
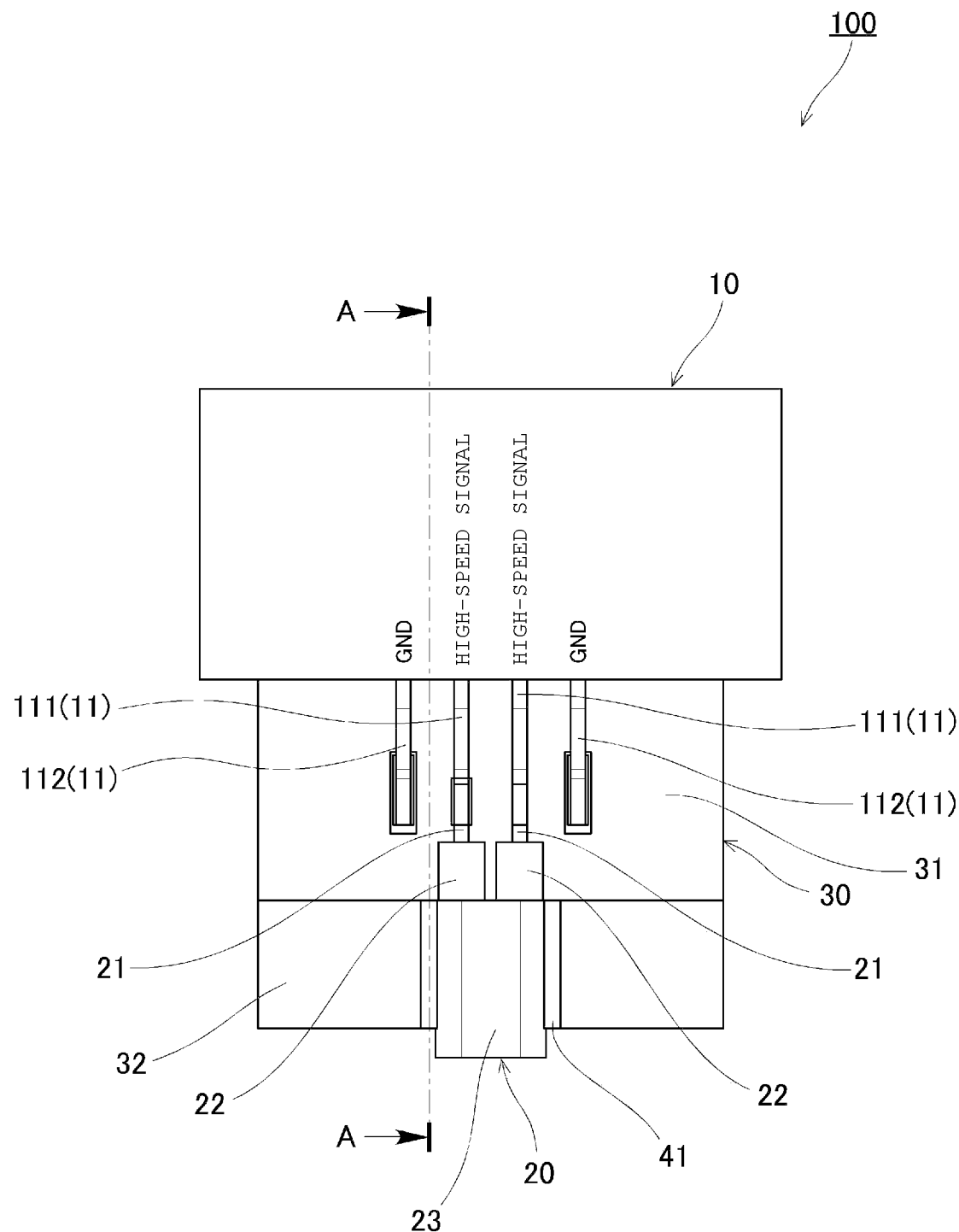
FIG. 2 is a top view of the connector cable of the first embodiment.
Figure 3:
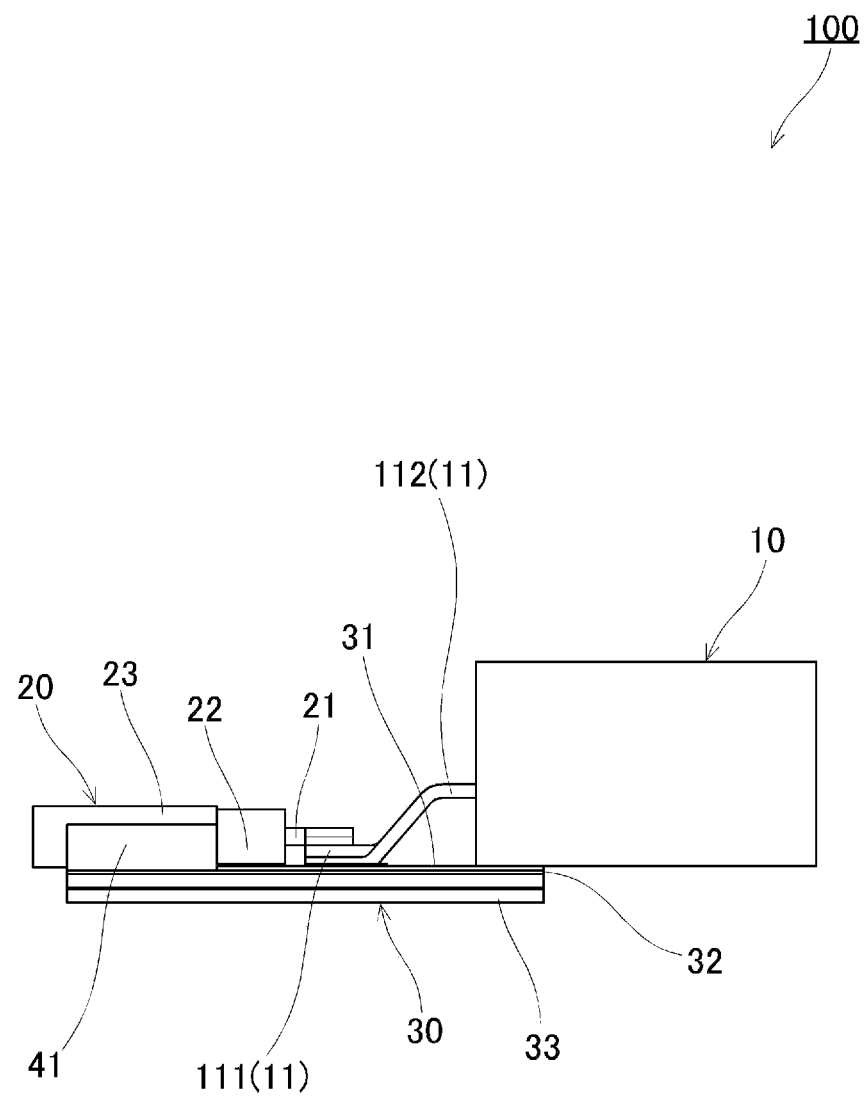
FIG. 3 is a left side view of the connector cable of the first embodiment.

The connector 10 has a fitting portion (not shown) on a front side, and has a conductive metal contact 11 on a rear side, which is a connection portion. In the connector 10 of the first embodiment, the fitting portion (not shown) is fitted with a mating connector, and this can make a connection including telecommunications or optical communications between the connector 10 and the mating connector. Further, the connector 10 of the first embodiment has four contacts 11. As shown in FIG. 2, in the four contacts 11, the two contacts 111 arranged in the center are used as connection portions for high-speed signals, and two contacts 112 arranged at both left and right ends are used as connection portions for ground (GND).

The shielded cable 20 includes an inner conductor 21, a dielectric 22 that covers the inner conductor 21, and a shield member 23 that covers the dielectric 22. The inner conductor 21 of the first embodiment is used as a conductor for transmitting high-speed signals. The dielectric 22 of the first embodiment is made of an insulating material such as polyethylene, and covers the entire circumference of the inner conductor 21 to protect the inner conductor 21. The shield member 23 of the first embodiment is a member that further covers the entire circumference of the dielectric 22, and is formed of, for example, a braided wire formed of a braided copper wire or an aluminum strip. The shield member 23 serves as an electromagnetic shield to protect the inner conductor 21 that transmits high-speed signals, from the influence of electromagnetic waves etc. arriving from the outside.

Note that, in the shielded cable 20 of the first embodiment shown in FIGS. 1 to 5, a configuration is illustrated in which two inner conductors 21 are respectively covered with two dielectrics 22, and the two dielectrics 22 covering the inner conductors 21 are covered with one shield member 23. However, the form of the shielded cable applicable to the present invention is not limited to that shown in FIGS. 1 to 5. Examples of shielded cable of the present invention to be used may include: a coaxial cable in which one inner conductor is covered with a dielectric and a shield member; a micro coaxial cable; as well as a high-speed signal cable of a type called STP (shielded twisted pair) cable or SPP (shielded parallel pair) cable. Further, the shielded cable of the present invention includes: a cable having a wire, called a drain wire, built-in over the entire length of the cable; and a cable having no built-in wire.

Figure 4:
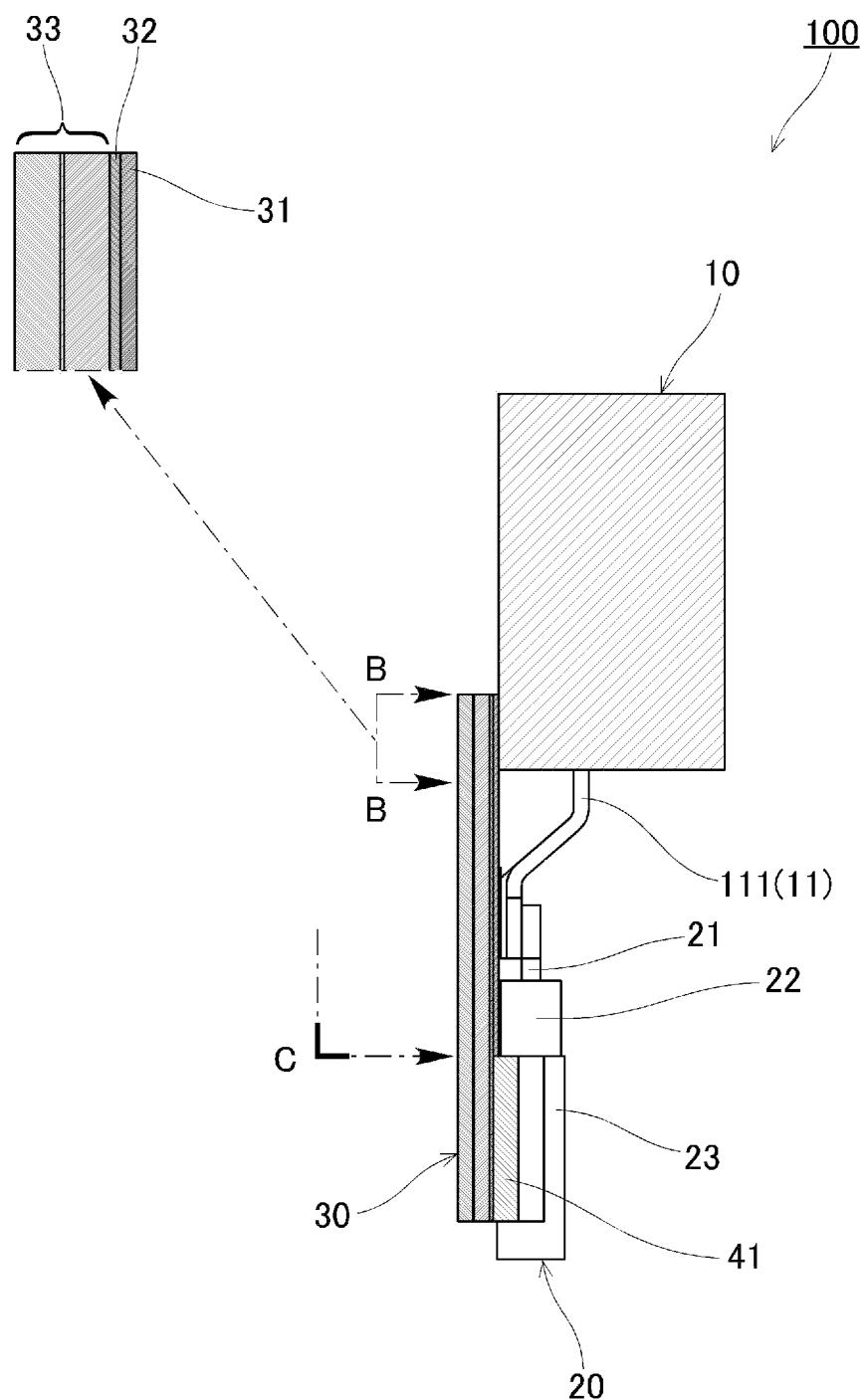
FIG. 4 is a longitudinal cross-sectional view showing a cross section taken along line A-A in FIG. 2, and the upper left part of the paper in this figure shows an enlarged cross-sectional view of a range between two arrows represented by reference characters B-B.

As shown in FIG. 4, on the bottom surface part of the relay substrate 30, there is formed a substrate layer 33 having two substrates attached therein, and on the front surface of the substrate layer 33, there is formed a GND conductor layer 32. Further, on the upper surface of the GND conductor layer 32, which is formed on the front surface of the substrate layer 33, there is formed an insulating member 31 made of an insulating material.

For the substrate layer 33 of the first embodiment, any conventionally known substrate material can be used. The substrate material includes, for example, a material using a phenol resin-based resin material, an epoxy resin-based resin material, a glass non-woven fabric impregnated with an epoxy resin, and an aluminum-based plate material. Further, the insulating member 31 of the first embodiment to be used includes a resist coated to the front surface of the GND conductor layer 32. The resist, which is the insulating member 31 of the first embodiment, is a coating material also called a solder resist. The resist demonstrates a function to prevent solder from adhering to unnecessary parts during soldering, and at the same time, protect the relay substrate 30 from dust, heat, moisture, etc. as a permanent protective film to maintain insulation.

The connector cable 100 of the first embodiment includes the above-described connector 10, the shielded cable 20, and the relay substrate 30. The connector 10 and the shielded cable 20 are connected via the relay substrate 30. Then, in the connector cable 100 of the first embodiment, as shown in FIGS. 1 to 4, the shield member 23 and the dielectric 22 of the shielded cable 20 are removed to expose the inner conductor 21. With this state, the exposed inner conductor 21 is directly connected to the contact 111 for high-speed signals of the connector 10. Here, the connection between the inner conductor 21 and the contact 111 for high-speed signals uses soldering. Thus directly connecting the inner conductor 21 and the contact 111 for high-speed signals can significantly reduce the substrate wiring loss as compared with the conventional connection via the substrate.

Figure 5:
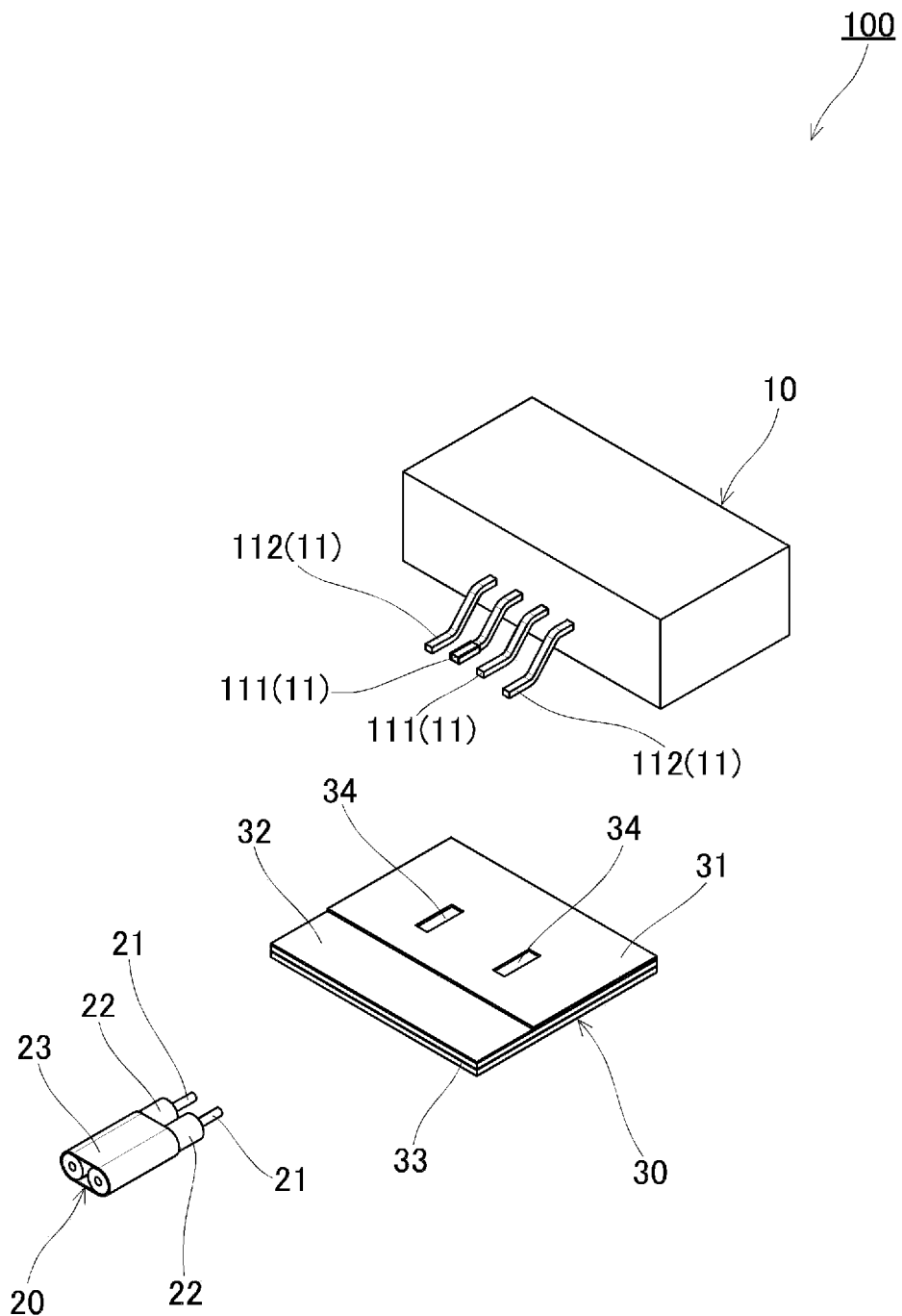
FIG. 5 is an exploded perspective view of the connector cable of the first embodiment as viewed from the upper left side of the rear surface.

Further, as shown in FIG. 5, the GND contact 112 provided in the connector 10 can be connected to the GND conductor layer 32 by means of: providing a GND conductor layer exposed portion 34, where no insulating member 31 made of a resist is coated, in a part of the GND conductor layer 32 on the front surface of the relay substrate 30; and placing the GND contact 112 at the position of the GND conductor layer exposed portion 34 and soldering it there.

As shown in FIG. 4, the first embodiment has a configuration such that: the GND conductor layer 32 on the front surface of the relay substrate 30 is arranged directly under a position where the shield member 23 is removed to expose the dielectric 22; and the GND conductor layer 32 on the front surface of the relay substrate 30, arranged directly under the part where the shield member 23 is removed, is covered with the insulating member 31 made of a resist. Further, as shown in FIG. 4, the first embodiment has a configuration such that: the GND conductor layer 32 on the front surface of the relay substrate 30 extends to a position directly under the contact 111 for high-speed signals of the connector 10 and the exposed inner conductor 21 of the shielded cable 20; and the GND conductor layer 32 on the front surface of the relay substrate 30, which extends to the positions directly under the contact 111 for high-speed signals of the connector 10 and the exposed inner conductor 21 of the shielded cable 20, is also covered with the insulating member 31 made of a resist.

Further, as shown in FIG. 4, the first embodiment has a configuration such that: the GND conductor layer 32 on the front surface of the relay substrate 30 is exposed at the position directly under the shield member 23 of the shielded cable 20. With this state, the GND conductor layer 32 is not covered with the insulating member 31 made of a resist. Then the shield member 23 of the shielded cable 20 and the GND conductor layer 32 on the front surface of the relay substrate 30 are fixedly connected by the solder 41.

The following describes the detailed structure of the connector cable 100 of the first embodiment with reference to FIG. 4. Thus soldering the shield member 23 of the shielded cable 20 to the GND conductor layer 32 on the front surface of the relay substrate 30 brings about effects such as noise prevention. In other words, the GND conductor layer 32 on the front surface of the relay substrate 30 is arranged at a position directly under the shield member 23 in a state in which the GND conductor layer 32 is not covered with the insulating member 31 made of a resist.

On the other hand, at the part where the shield member 23 of the shielded cable 20 is removed and the dielectric 22 is exposed, the impedance increases because the dielectric 22 has no covering. The countermeasure is arranging the GND conductor layer 32 on the front surface of the relay substrate 30 in a state of being covered with an insulating member 31 made of a resist at a position directly under the exposed dielectric 22, to obtain the effect of lowering impedance.

In other words, the GND conductor layer 32 on the front surface of the relay substrate 30 has a boundary at a position indicated by reference character C in FIG. 4. The one side of the boundary, where the connector 10 is arranged, is coated with an insulating member 31 made of a resist, and the other side thereof, where the shield member 23 of the shielded cable 20 is located, is not coated with an insulating member 31 made of a resist. This countermeasure achieves impedance matching in the connector cable 100 of the first embodiment.

In other words, the connector cable 100 of the first embodiment has the insulating member 31 and the GND conductor layer 32 on the front surface of the relay substrate 30, directly under the part where the shield member 23 of the shielded cable 20 has been removed. This effectively prevents increase in impedance. Additionally, in the connector cable 100 of the first embodiment, the contact 111 for high-speed signals of the connector 10 and the inner conductor 21 of the shielded cable 20 are connected directly by soldering. This eliminates, for example, need for process of bending (forming) the inner conductor 21 to the front surface of the substrate. Further, GND conductor layer 32 on the front surface of the relay substrate 30, arranged directly under the part where the shield member 23 is removed, is not adjacent to the inner conductor 21 of the shielded cable 20. Specifically, the GND conductor layer 32 is separated from the inner conductor 24 in the vertical direction, and the insulating member 31 is interposed between the two members. As a result, there is no short circuit. Thus, the connector cable 100 of the first embodiment can bring the effects described above. From the above, according to the connector cable 100 of the first embodiment, there can be provided a connector cable that prevents both increase in impedance and a short circuit.

The above has described the first embodiment, which is one possible embodiment of the connector cable of the present invention, with reference to FIGS. 1 to 5. However, the technical scope of the present invention is not limited to the scope described in the first embodiment. Various modifications or improvements can be made to the first embodiment. Then, the following describes various possible embodiments of the connector cable of the present invention. In each of the embodiments described below, the same or similar members as those in the above-described first embodiment are designated by the same reference numerals and characters, and the description thereof is to be omitted.

Second Embodiment

Figure 6:
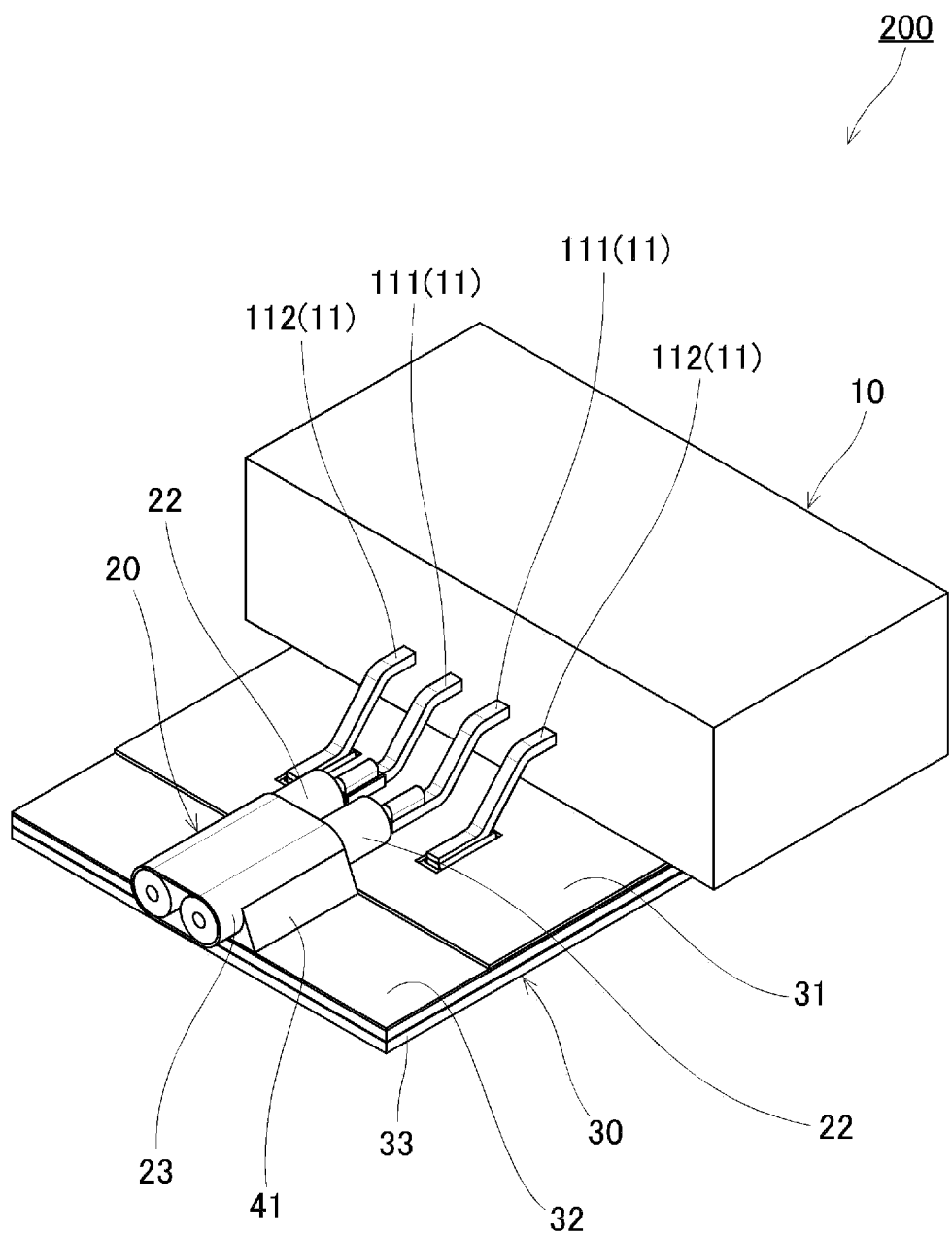
FIG. 6 is a perspective view of a connector cable of a second embodiment as viewed from the upper left side of a rear surface.
Figure 7:
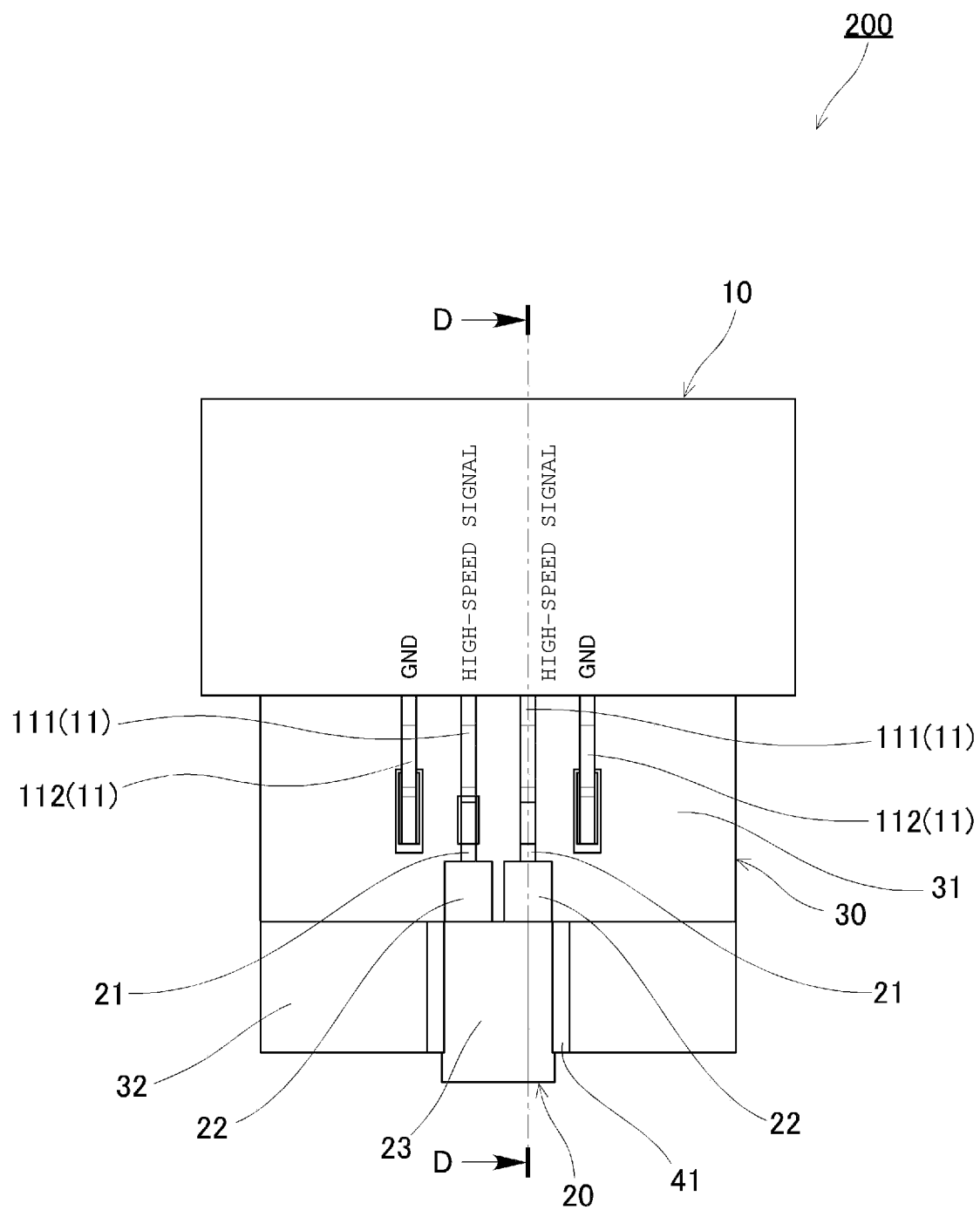
FIG. 7 is a top view of the connector cable of the second embodiment.
Figure 8:
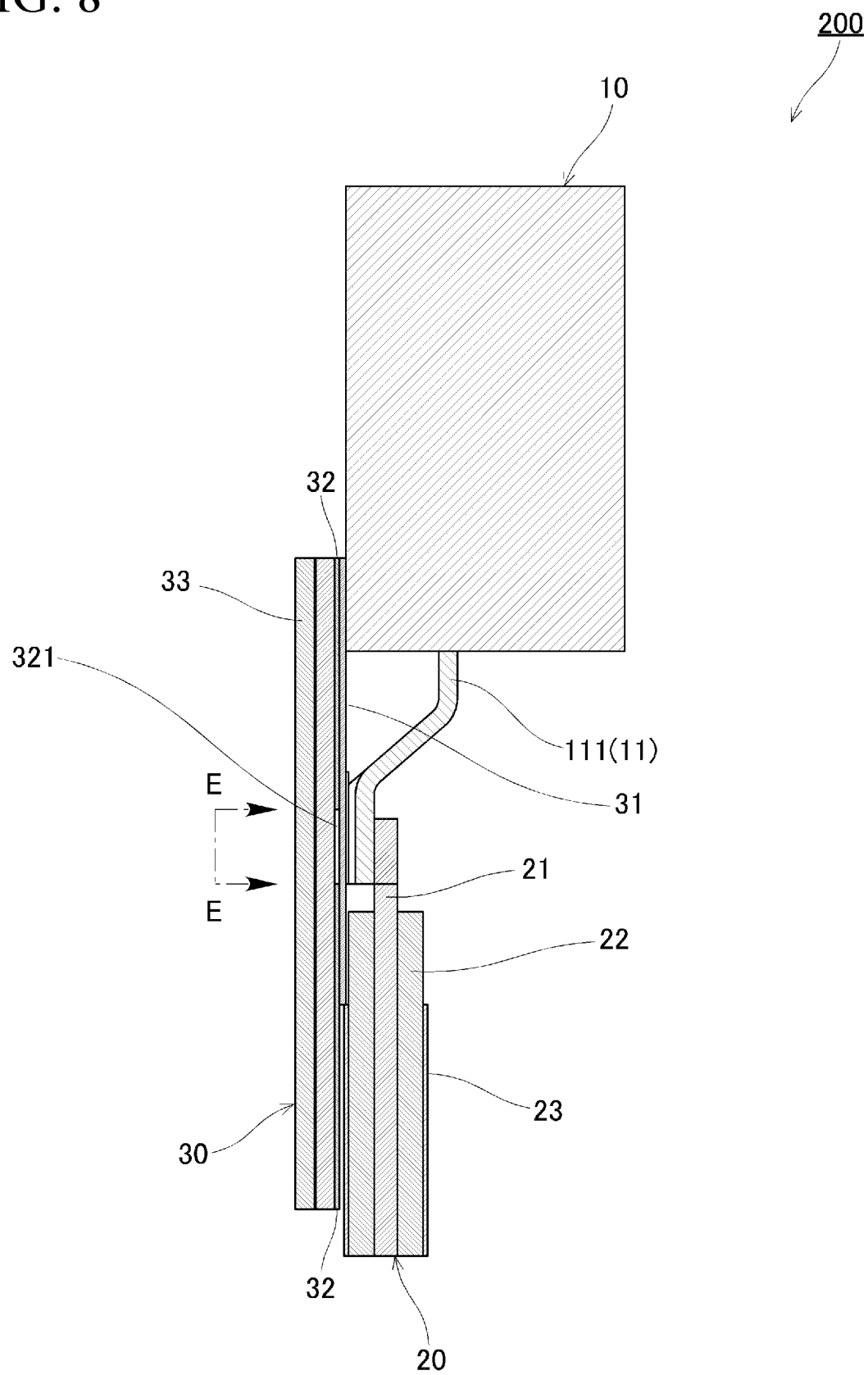
FIG. 8 is a longitudinal cross-sectional view showing a cross section taken along line D-D in FIG. 7.
Figure 9:
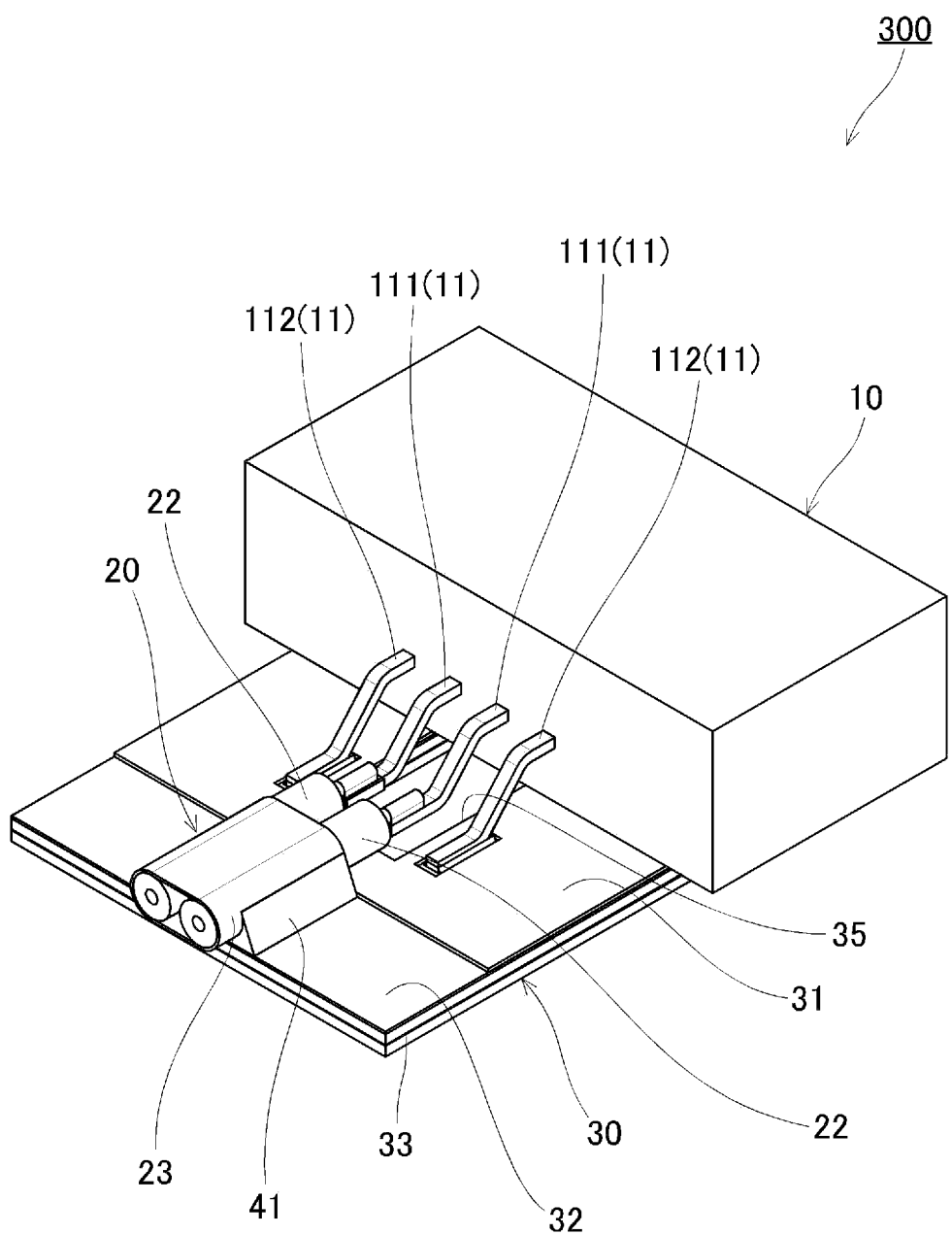
FIG. 9 is a perspective view of a connector cable of a third embodiment as viewed from the upper left side of a rear surface.
Figure 10:
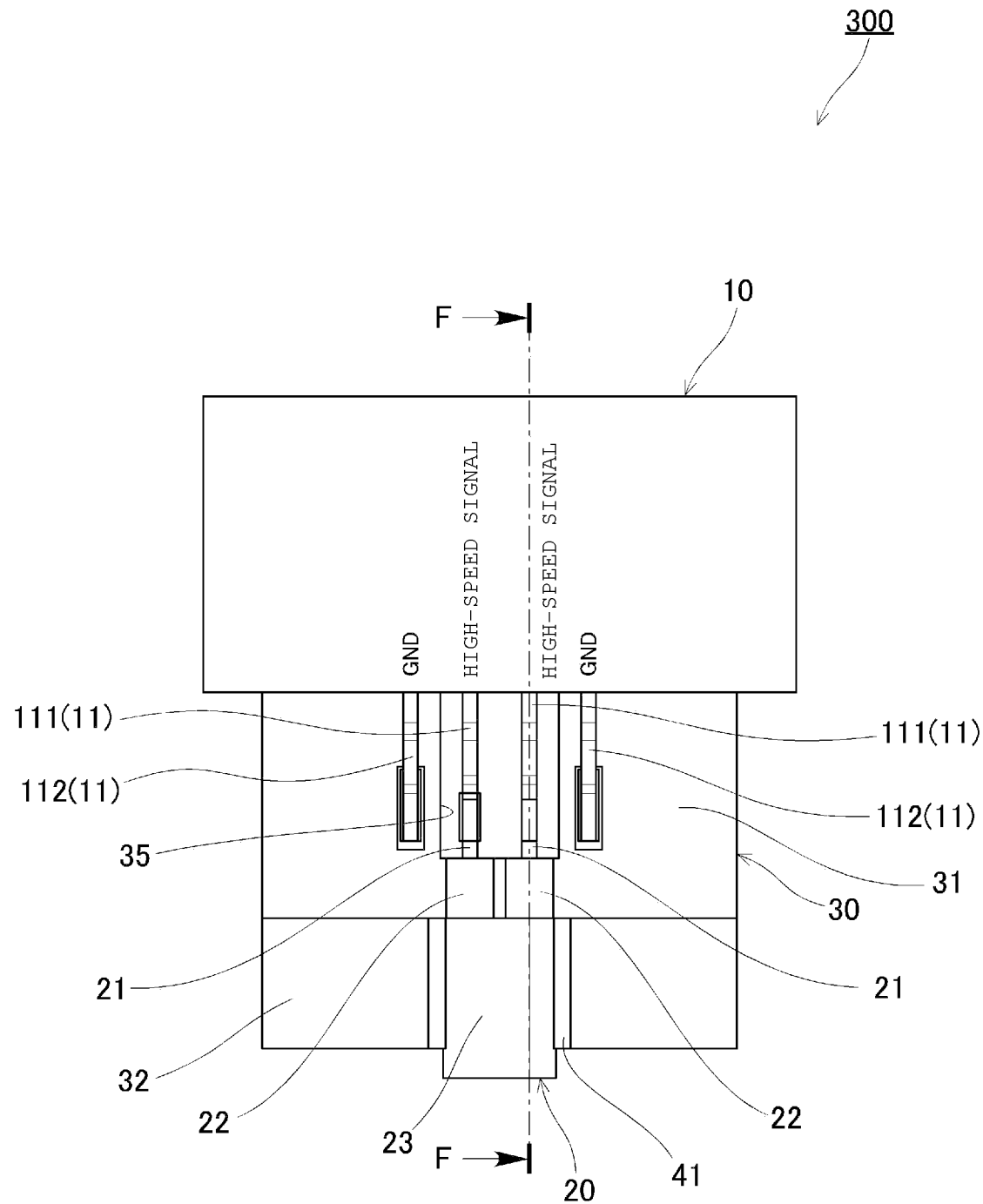
FIG. 10 is a top view of the connector cable of the third embodiment.
Figure 11:
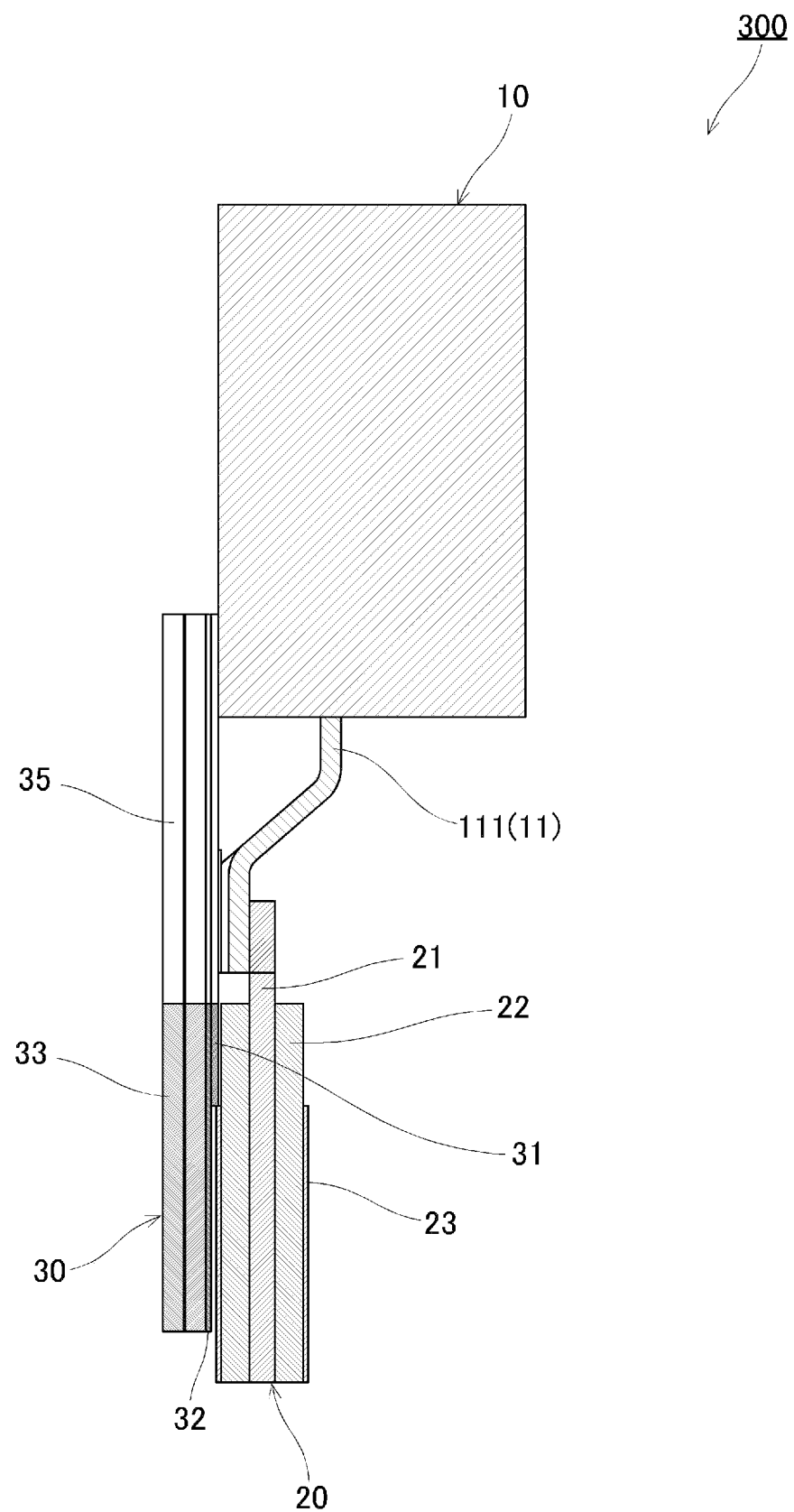
FIG. 11 is a longitudinal cross-sectional view showing a cross section taken along line F-F in FIG. 10.
Figure 12:
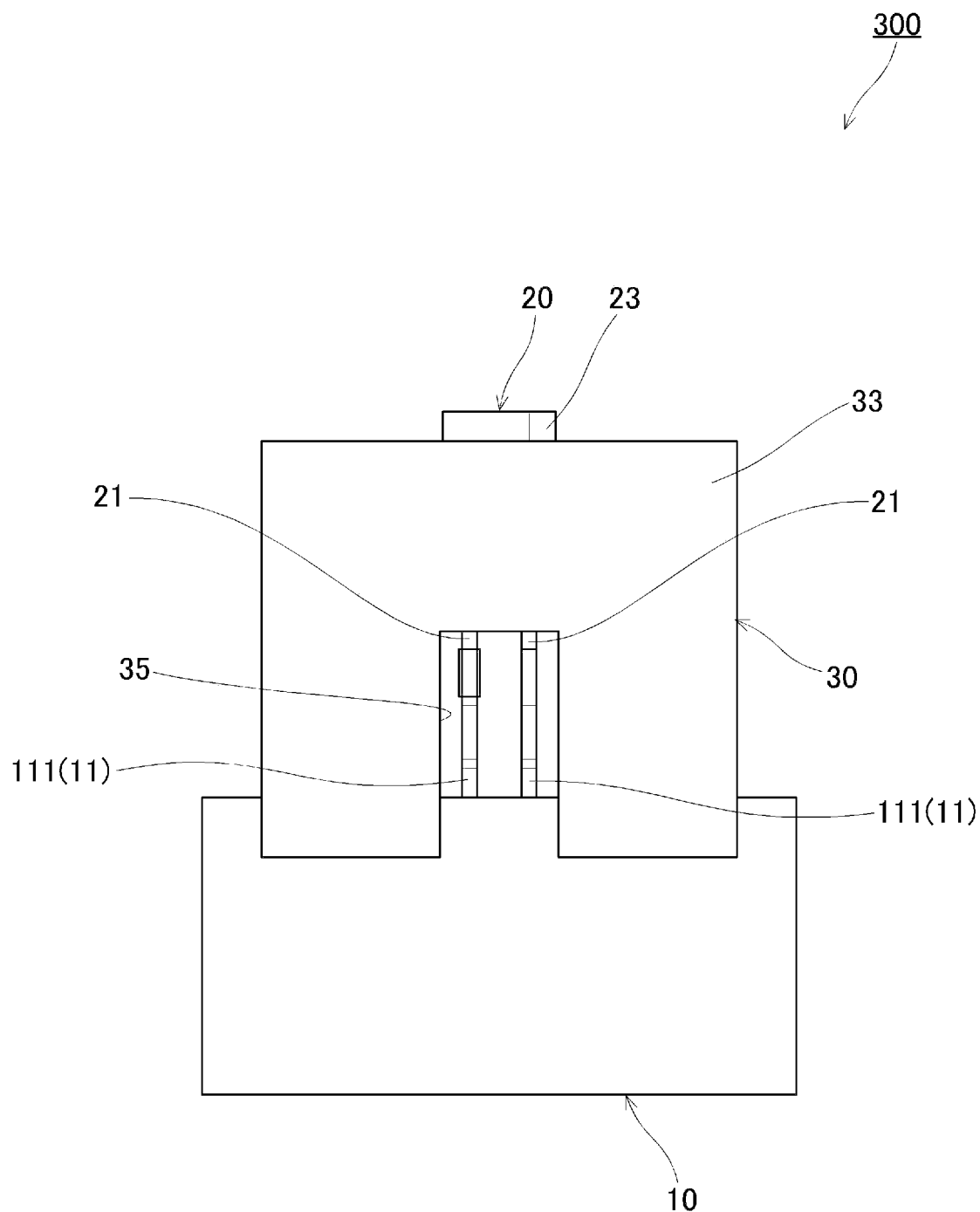
FIG. 12 is a bottom view of the connector cable of the third embodiment.

The following describes a connector cable 200 of a second embodiment with reference to FIGS. 6 to 8.

In the connector cable 200 of the second embodiment, the connection part between the contact 111 for high-speed signals of the connector 10 and the exposed inner conductor 21 of the shielded cable 20 is connected by soldering, as in the case of the first embodiment described above. Additionally, as shown in more detail in FIG. 8, the connector cable 200 of the second embodiment has the GND conductor layer 32 on the front surface of the relay substrate 30. The GND conductor layer 32 located directly under the connection part between the contact 111 for high-speed signals and the inner conductor 21 is cut out in the range of arrow indicated by reference character E in FIG. 8. Thus, the connector cable 200 has a structural feature in which there is formed a GND cut-out region 321 where the GND conductor layer 32 is absent.

Here, the connection part between the contact 111 for high-speed signals and the inner conductor 21 is connected by soldering, so that a problem arises in which the impedance decreases only at this part. To solve this problem, in the second embodiment, the GND conductor layer 32 on the front surface of the relay substrate 30 is cut out directly under the connection part between the contact 111 for high-speed signals and the inner conductor 21. This forms a GND cut-out region 321 where the GND conductor layer 32 is absent, to increase the impedance. As a result, the second embodiment can achieve impedance matching of the connector cable 200 as a whole. In other words, according to the connector cable 200 of the second embodiment, there can be provided a connector cable that prevents both increase in impedance and a short circuit, and achieves more suitable impedance matching.

Third Embodiment

The following describes a connector cable 300 of a third embodiment with reference to FIGS. 9 to 12.

In the connector cable 300 of the third embodiment, the connection part between the contact 111 for high-speed signals of the connector 10 and the exposed inner conductor 21 of the shielded cable 20 is connected by soldering, as in the case of the first embodiment described above. Additionally, in the connector cable 300 of the third embodiment, the relay substrate 30 itself located directly under the connection part between the contact 111 for high-speed signals and the inner conductor 21 is cut out, as shown in FIGS. 9 to 12. Thus, the connector cable 300 has a structural feature in which there is formed a substrate cut-out region 35 where the relay substrate 30 itself is absent.

Here, the connection part between the contact 111 for high-speed signals and the inner conductor 21 is connected by soldering, so that a problem arises in which the impedance decreases only at this part. To solve this problem, the relay substrate 30 itself is cut out directly under the connection part between the contact 111 for high-speed signals and the inner conductor 21 in the third embodiment. This forms a substrate cut-out region 35 where the substrate including the GND conductor layer 32 is absent to increase the impedance. As a result, the third embodiment can achieve the impedance matching of the connector cable 300 as a whole. In other words, according to the connector cable 300 of the third embodiment, there can be provided a connector cable that prevents both increase in impedance and a short circuit, and achieves more suitable impedance matching, as in the second embodiment described above.

Fourth Embodiment

Figure 13:
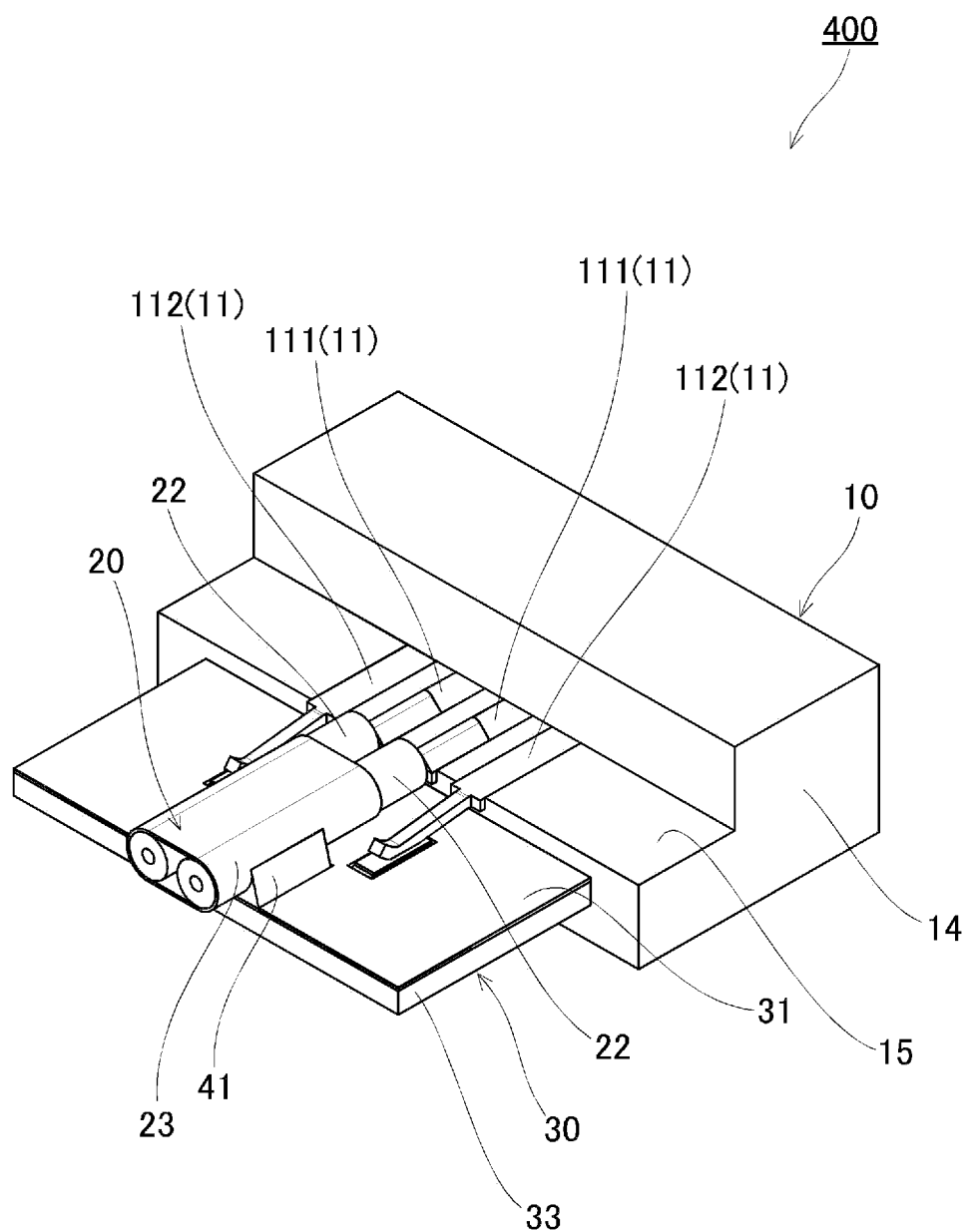
FIG. 13 is a perspective view of a connector cable of a fourth embodiment as viewed from the upper left side of a rear surface.
Figure 14:
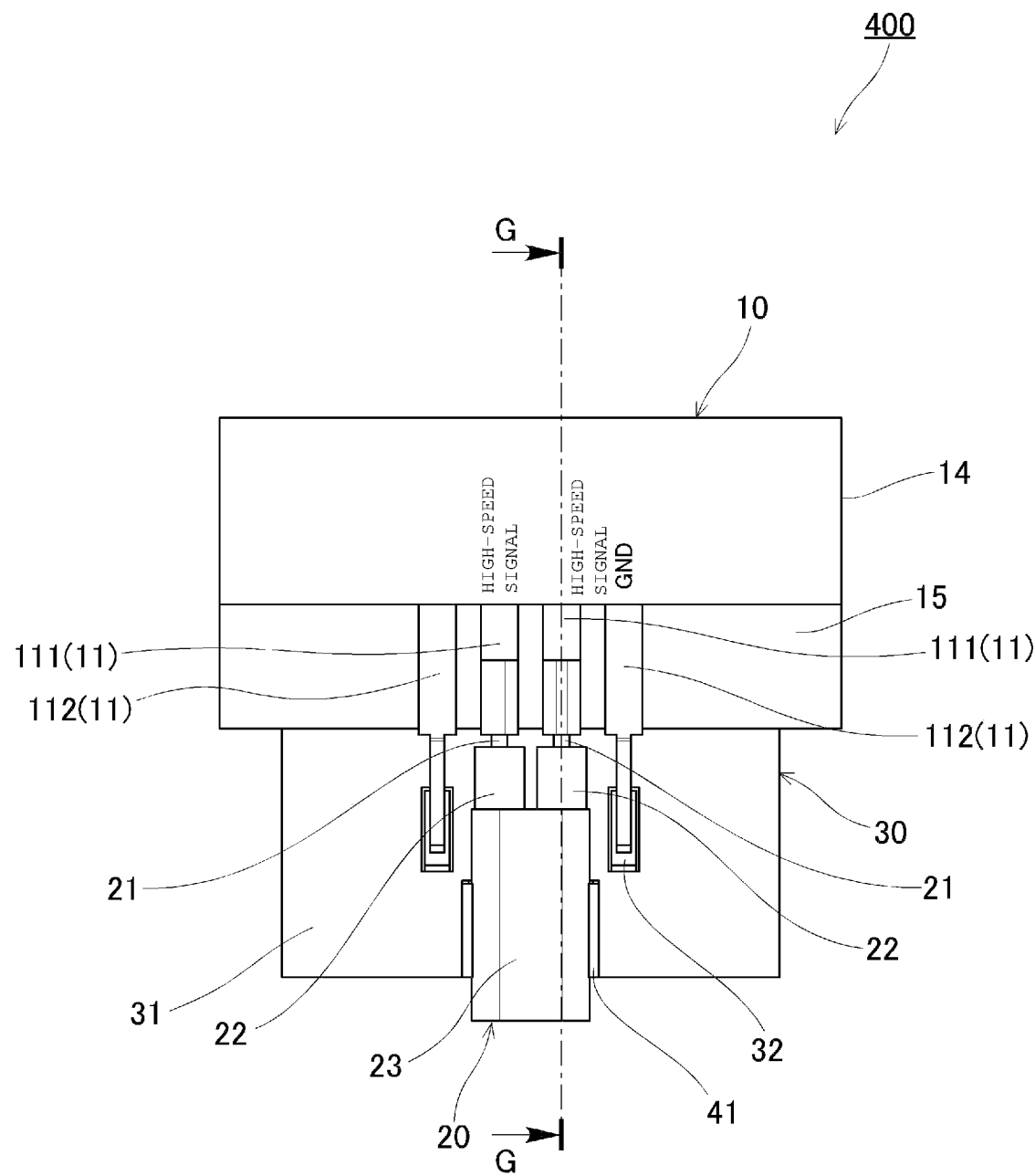
FIG. 14 is a top view of the connector cable of the fourth embodiment.
Figure 15:
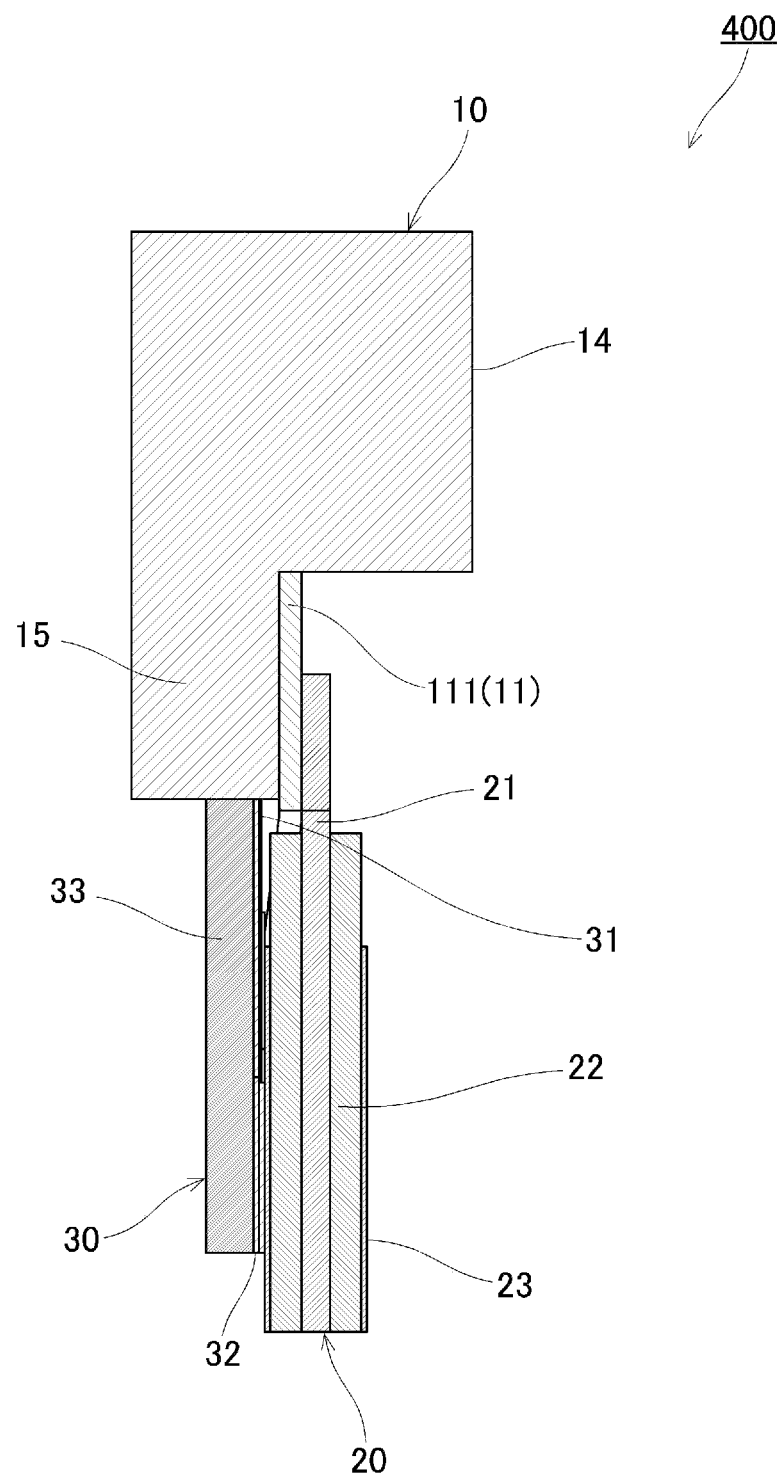
FIG. 15 is a longitudinal cross-sectional view showing a cross section taken along line G-G in FIG. 14.
Figure 16:
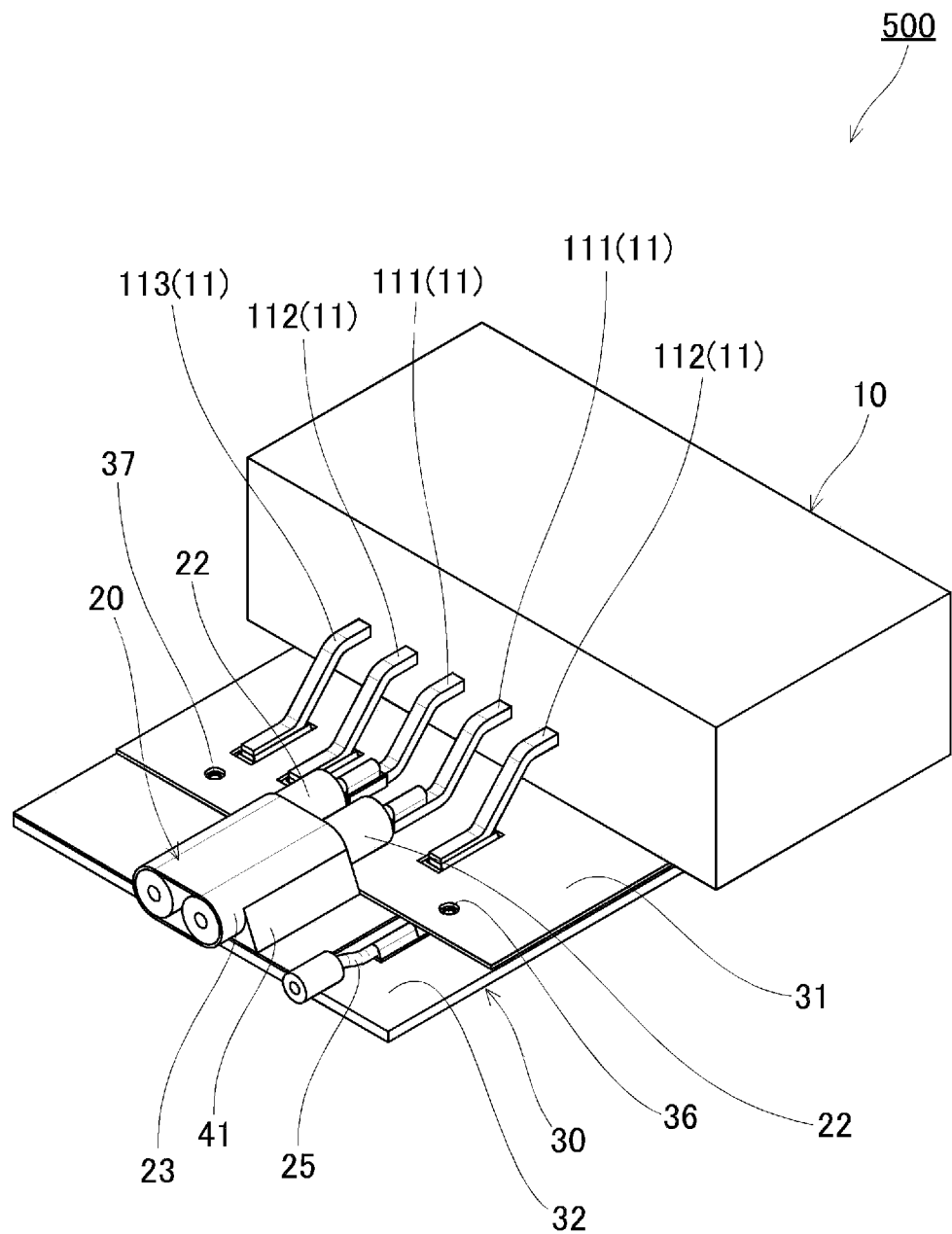
FIG. 16 is a perspective view of a connector cable of a fifth embodiment as viewed from the upper left side of a rear surface.

The following describes a connector cable 400 of a fourth embodiment with reference to FIGS. 13 to 15.

In the connector cable 400 of the fourth embodiment, the connection part between the contact 111 for high-speed signals of the connector 10 and the exposed inner conductor 21 of the shielded cable 20 is connected by soldering, as in the case of the first embodiment described above. Additionally, in the connector cable 400 of a fourth embodiment, the connector mold 14 that configures the connector 10 by installation of the contact 11 includes a contact 11 of the connector 10 and a connector mold extension portion 15 extending to directly under the connection part, as shown in FIGS. 13-15.

Then, the connection part between the contact 111 for high-speed signals and the inner conductor 21 is connected by soldering, so that a problem arises in which the impedance decreases only at this part. To solve this problem, in the fourth embodiment, a connector mold extension portion 15, which is a part of the connector mold 14, is formed up to a position directly under the connection part between the contact 111 for high-speed signals and the inner conductor 21. This forms a region where the substrate including the GND conductor layer 32 is absent, to increase the impedance. As a result, the fourth embodiment can achieve the impedance matching of the connector cable 400 as a whole. In other words, according to the connector cable 400 of the fourth embodiment, there can be provided a connector cable that prevents both increase in impedance and a short circuit, and achieves more suitable impedance matching, as in the case of the second and third embodiments described above.

Therefore, the connector cable 200 of the second embodiment, the connector cable 300 of the third embodiment, and the connector cable 400 of the fourth embodiment can have the advantage of preventing local impedance reduction and providing more suitable impedance matching.

Fifth Embodiment

The following describes a connector cable 500 of a fifth embodiment with reference to FIGS. 16 to 20.

The connector cable 500 of the fifth embodiment shows a configuration example in which types of the contact 11 of the connector 10 are various, and a plurality of types of the contact 11 are mixed as compared to the case of the first embodiment described above.

Figure 17:
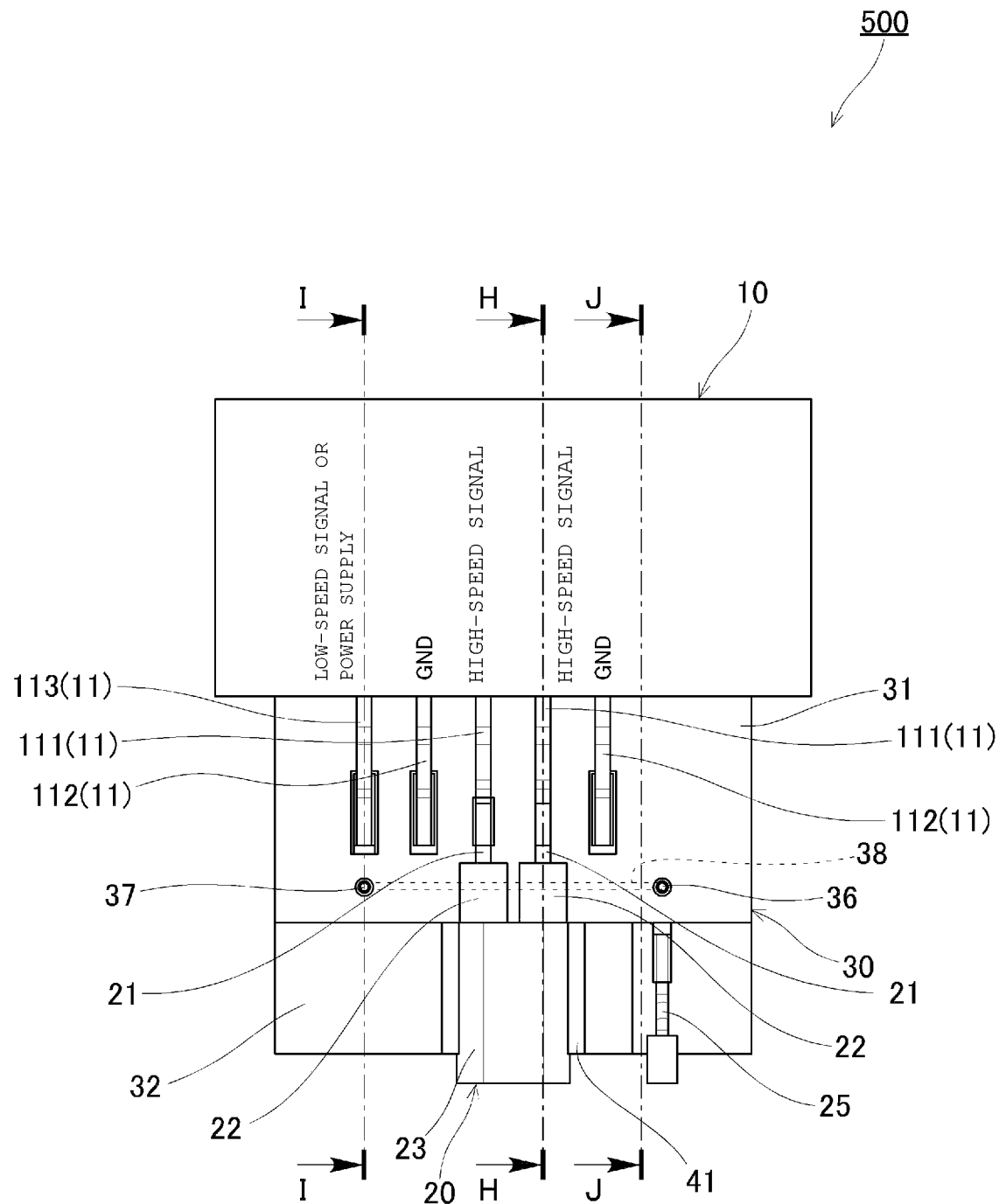
FIG. 17 is a top view of the connector cable of the fifth embodiment.
Figure 18:
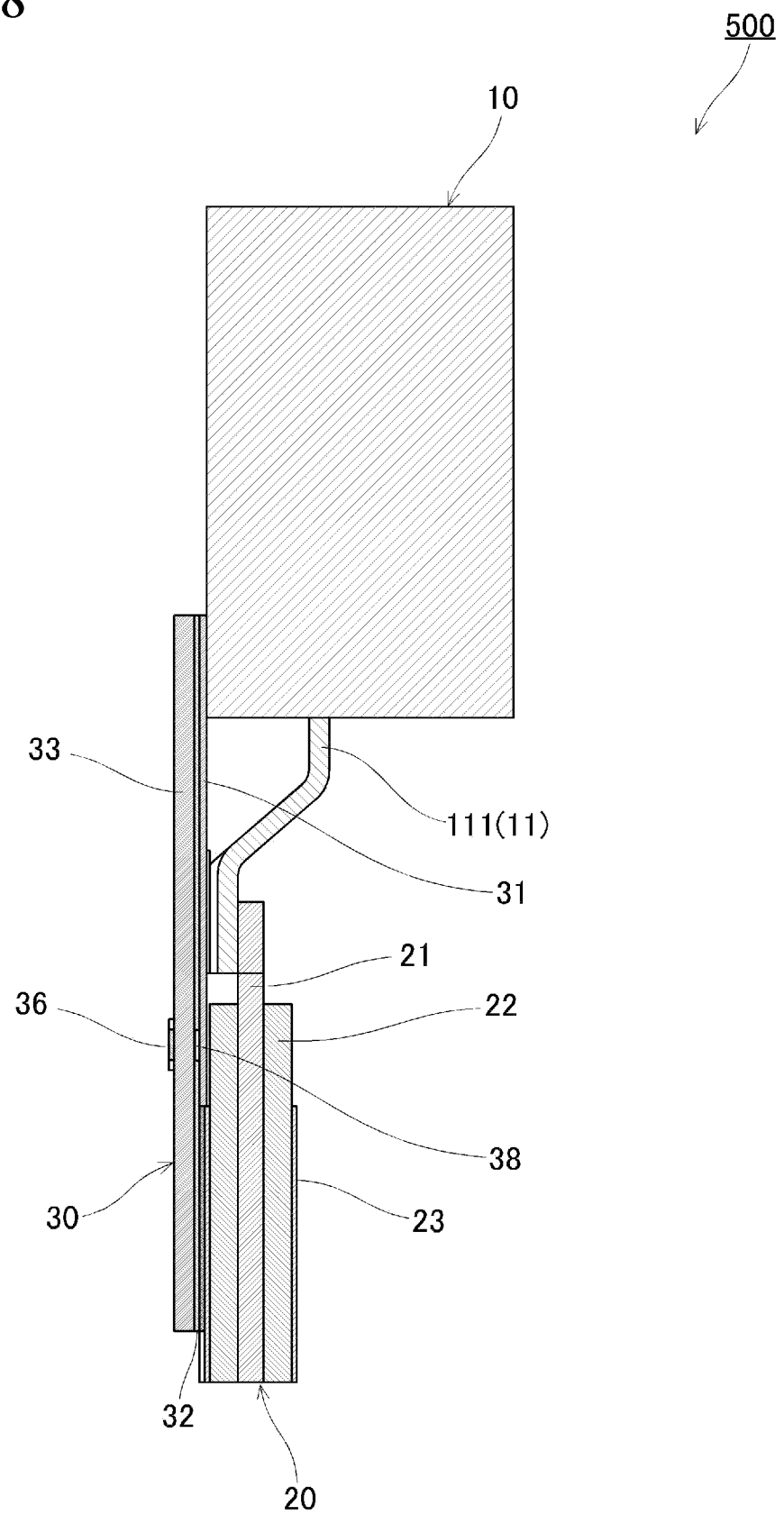
FIG. 18 is a longitudinal cross-sectional view showing a cross section taken along line H-H in FIG. 17.
Figure 19:
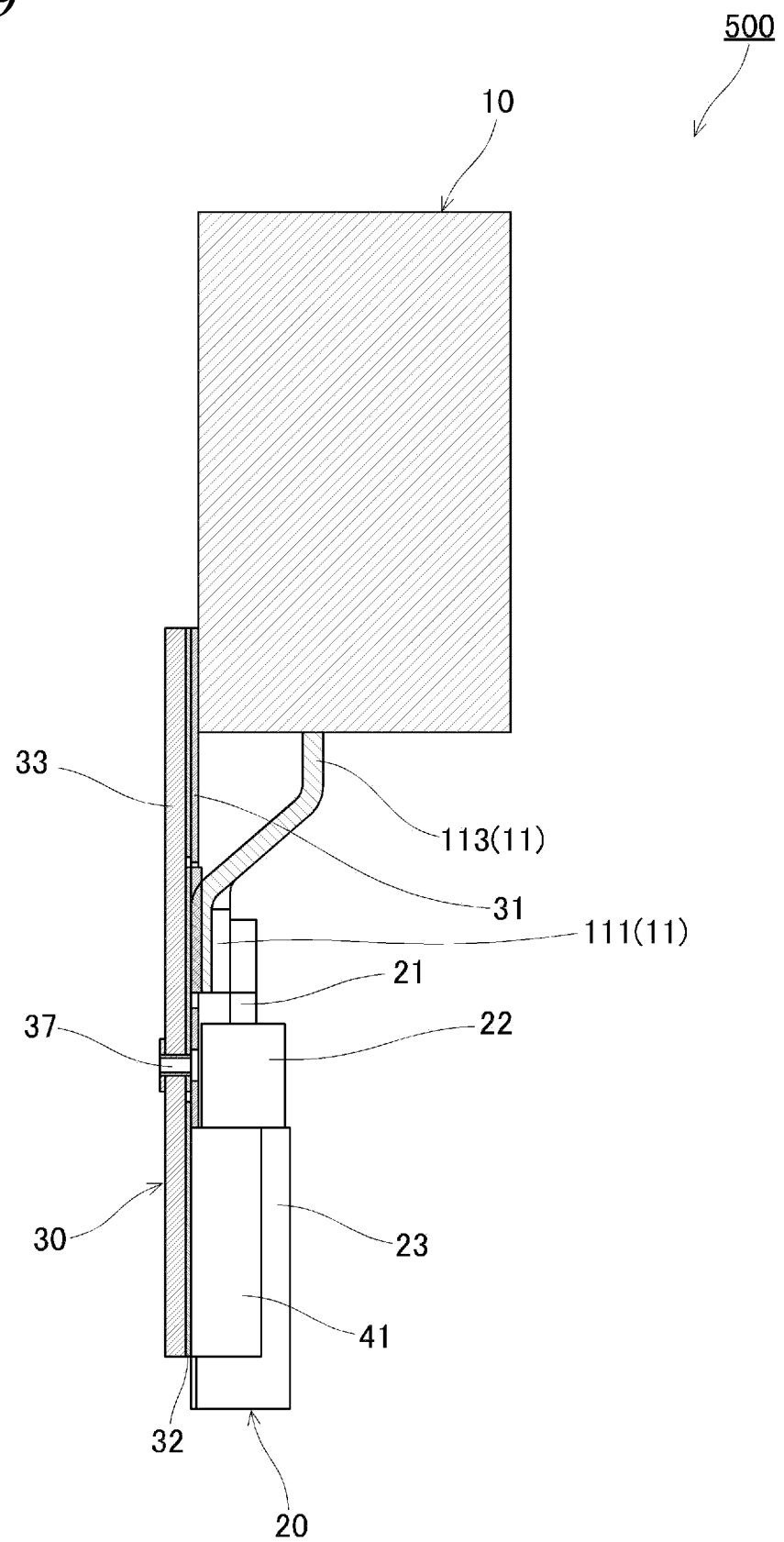
FIG. 19 is a longitudinal cross-sectional view showing a cross section taken along line I-I in FIG. 17.
Figure 20:
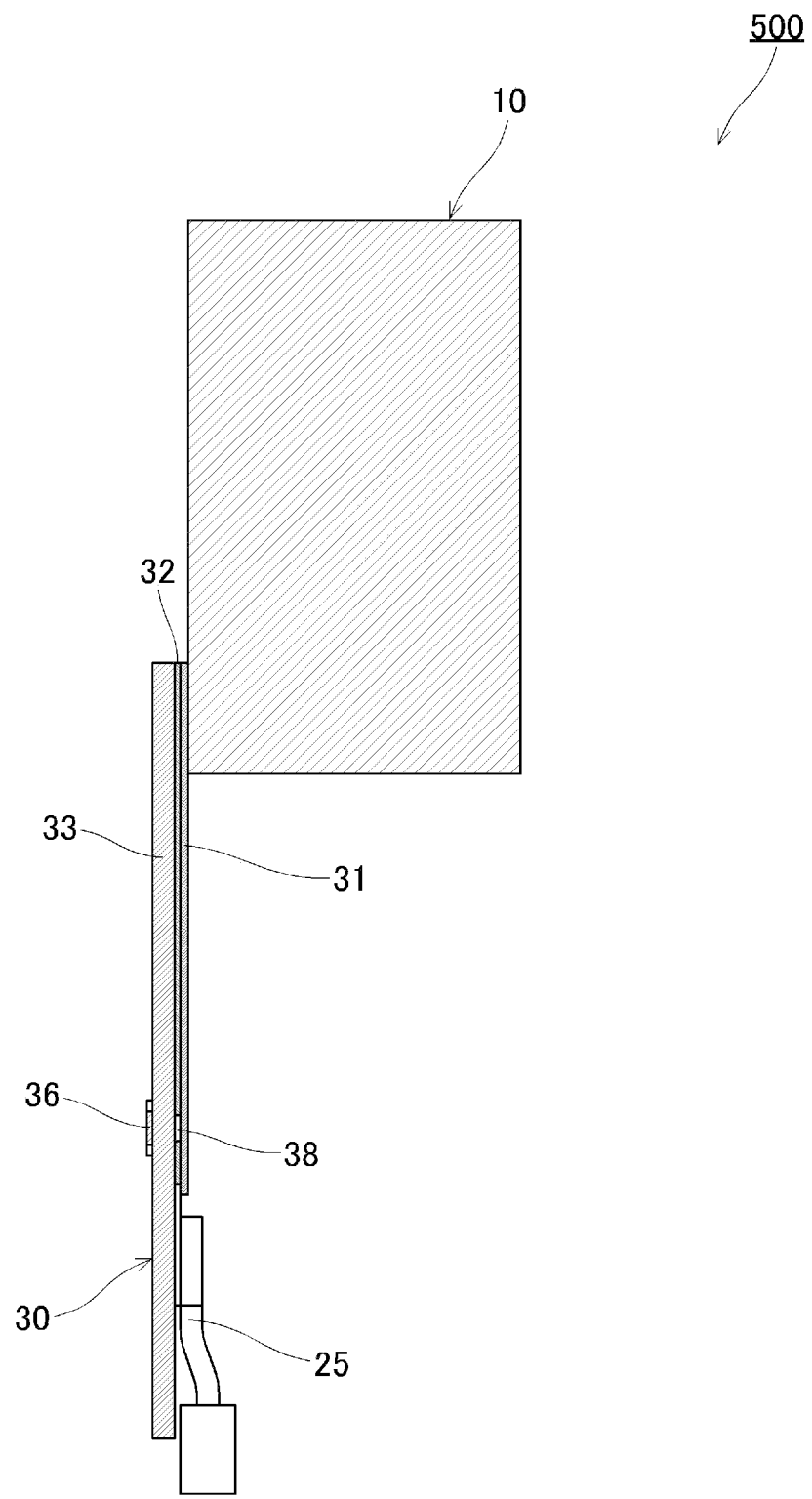
FIG. 20 is a longitudinal cross-sectional view showing a cross section taken along line J-J in FIG. 17.
Figure 21:
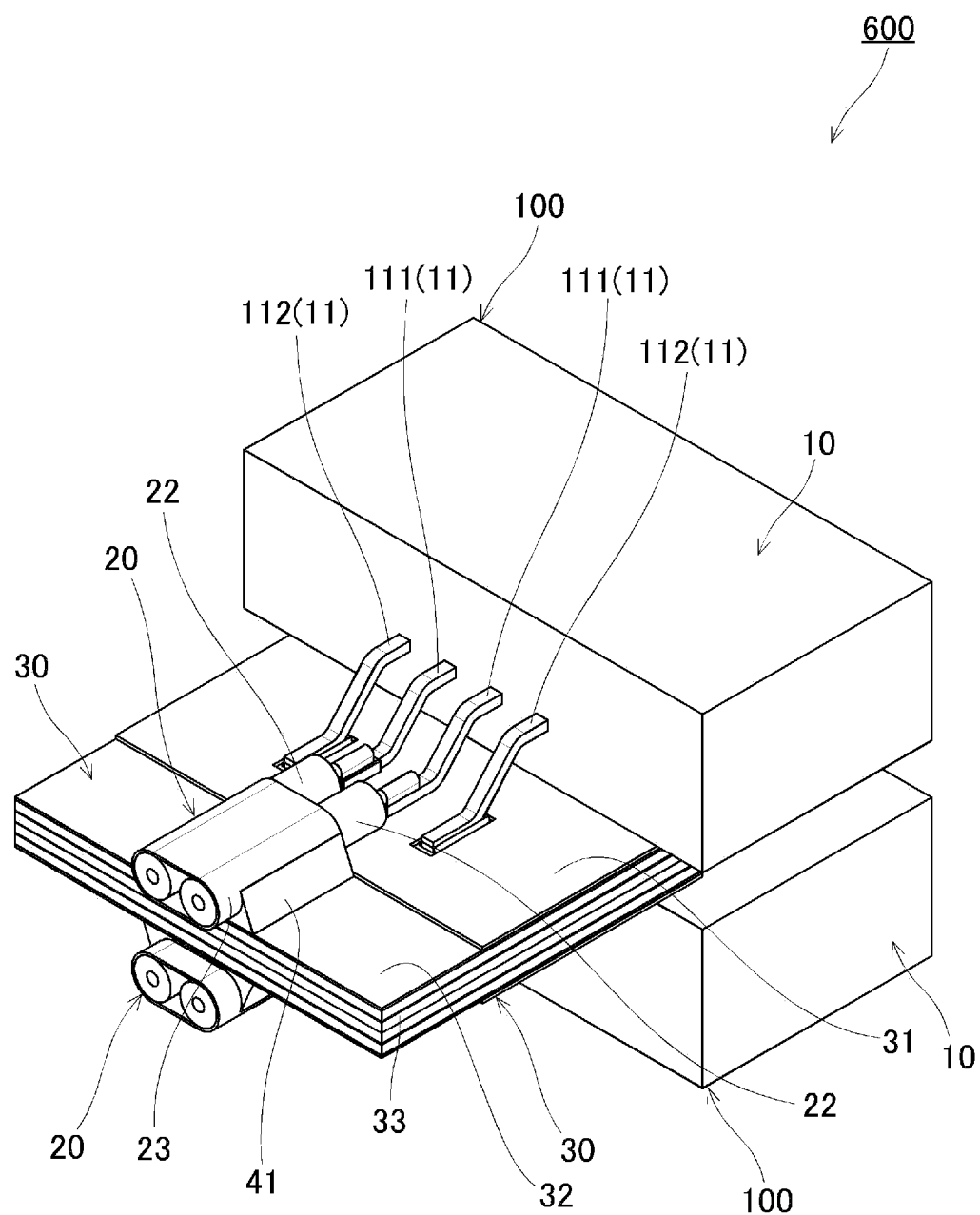
FIG. 21 is a perspective view of a connector cable of a sixth embodiment as viewed from the upper left side of a rear surface.
Figure 22:
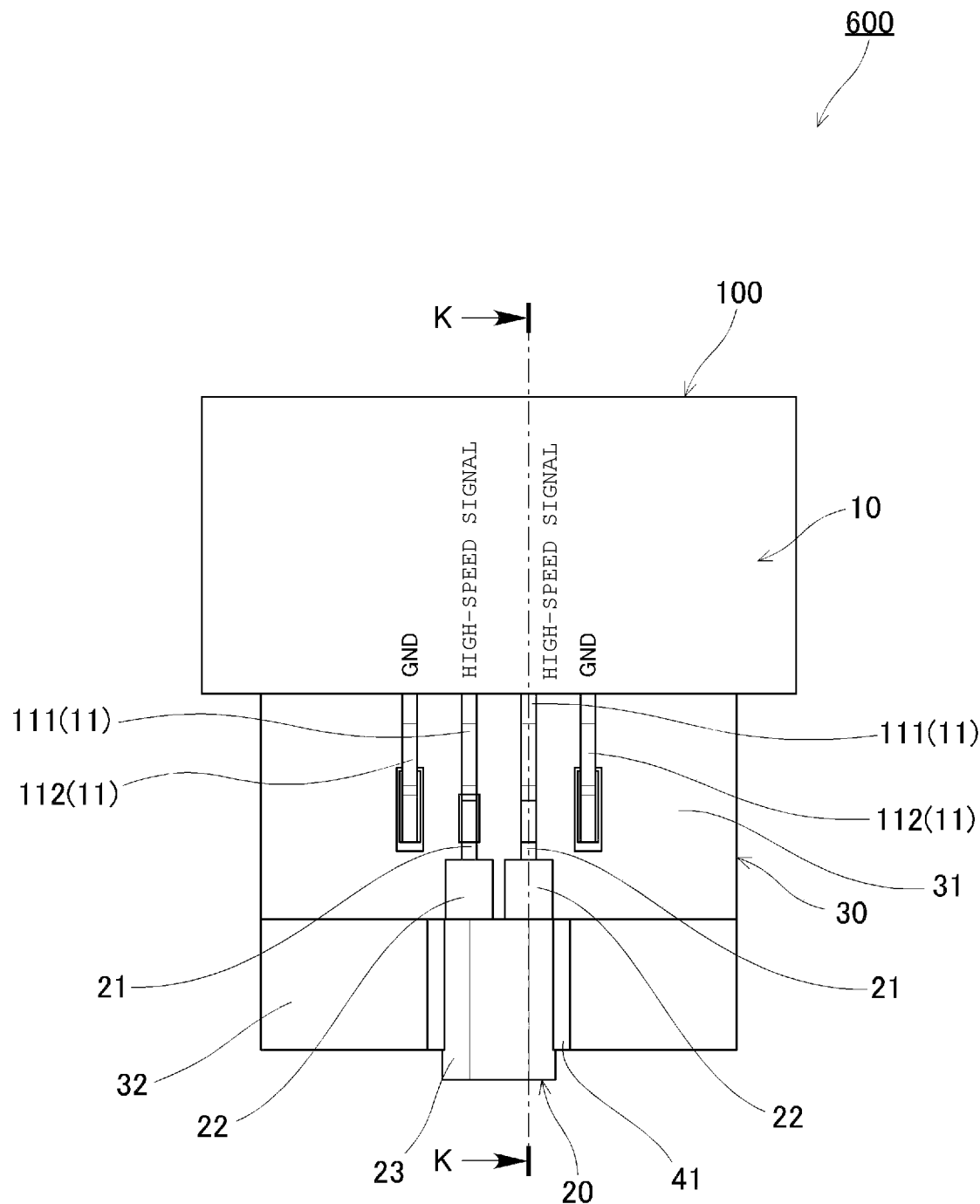
FIG. 22 is a top view of the connector cable of the sixth embodiment.
Figure 23:
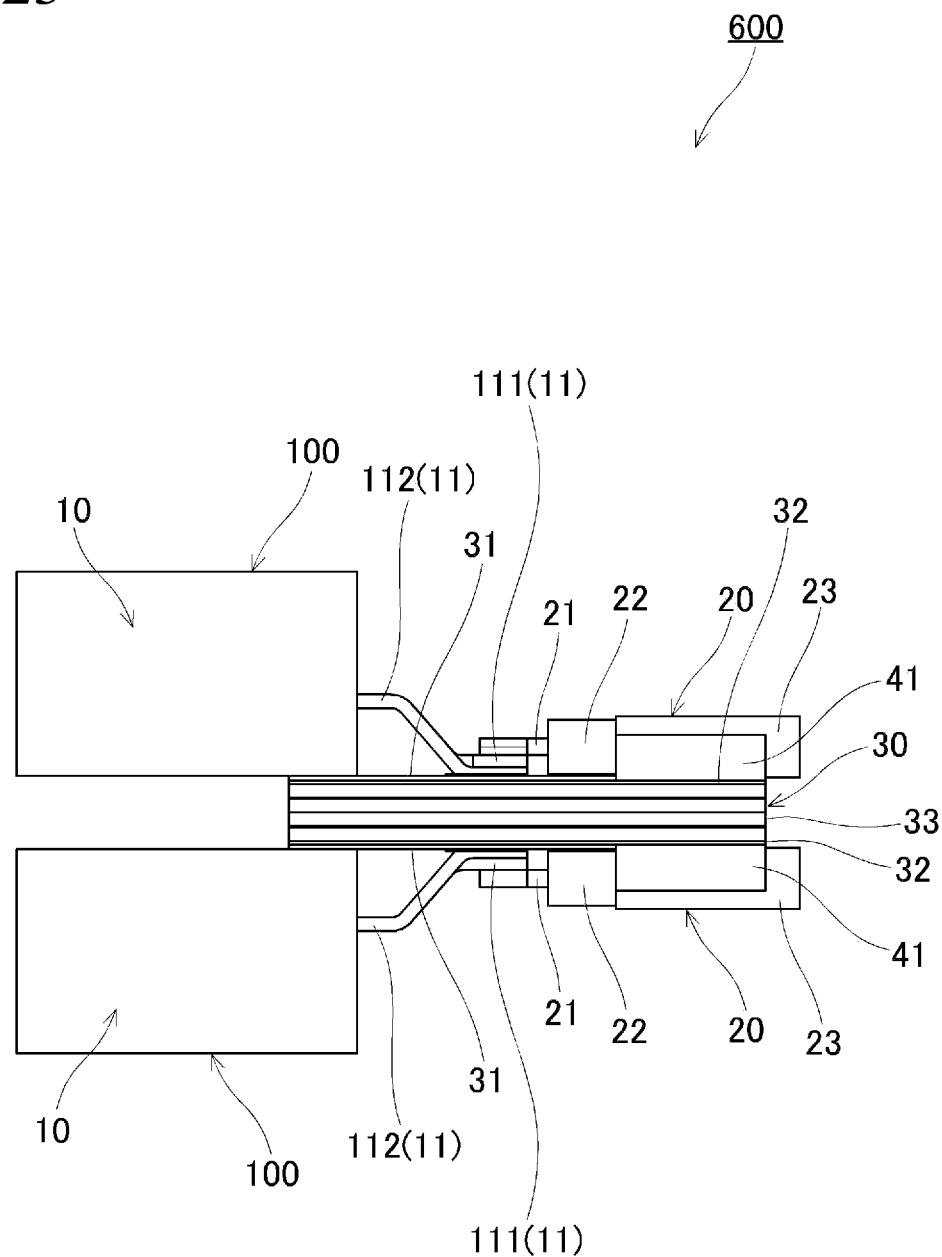
FIG. 23 is a right side view of the connector cable of the sixth embodiment.
Figure 24:
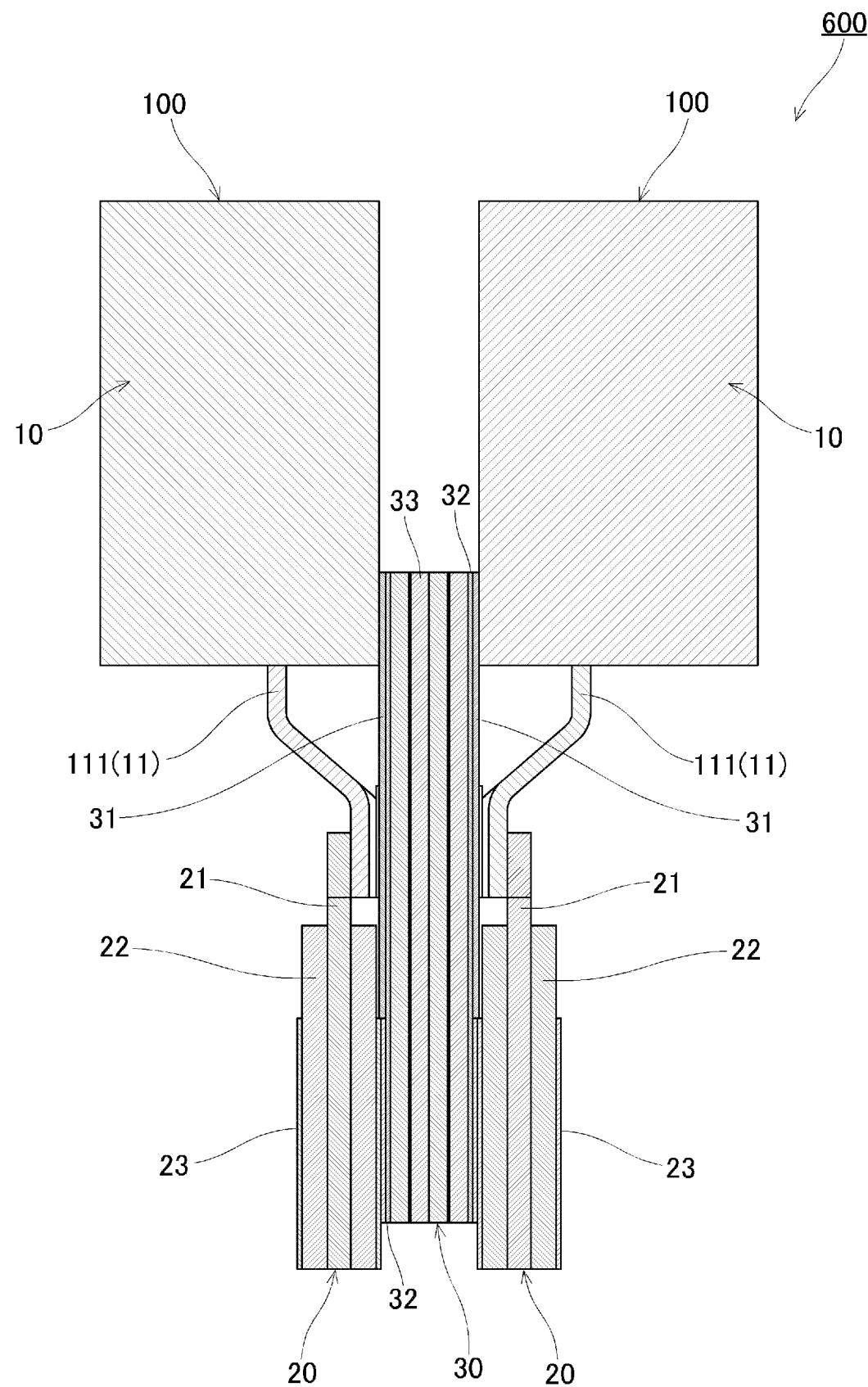
FIG. 24 is a longitudinal cross-sectional view showing a cross section taken along line K-K in FIG. 22.

Specifically, the connector 10 of the fifth embodiment has five contacts 11 installed therein. As shown in FIG. 17, the five contacts 11 include one contact 112 for one GND (ground), two contacts 111 for high-speed signals, one contact 112 for one GND (ground), and one contact 113 for the power supply (or for low-speed signals), which are arranged in this order from the left end to the right end.

On the other hand, the shielded cable 20 is installed in the same arrangement as in the first to third embodiments described above, which achieves appropriate impedance matching. However, the connector cable 500 of the fifth embodiment includes unshielded cables 25 such as cables for power supply or cables for low-speed signals. Therefore, it is necessary to connect the unshielded cable 25 to the contact 113 for power supply (or for low-speed signals). However, the specifications and usage conditions of the connector cable 500 may arrange the unshielded cable 25 and the contact 113 for power supply (or for low-speed signals) at separate positions, as shown in FIG. 17 etc.

A countermeasure for this case in the connector cable 500 of the fifth embodiment is forming two vias 36, 37 on the relay substrate 30, and providing a substrate inner conductor 38 connecting these two vias 36, 37 inside the relay substrate 30. Such a configuration allows the unshielded cable 25 to connect to the contact 113 for power supply (or low-speed signals) of the connector 10 via the substrate inner conductor 38 provided inside the relay substrate 30. In other words, the connector cable 500 of the fifth embodiment does not disturb the impedance matched connection between the contact 111 for high-speed signals and the exposed inner conductor 21 of the shielded cable 20, and can connect an unshielded cable 25 to the contact 113 for power supply (or for low-speed signals) of the connector 10. Therefore, according to the fifth embodiment, there can be provided a connector cable 500 in which cable routing is easy.

Note that the vias 36, 37 and the substrate inner conductor 38 of the fifth embodiment configures the conductor of the present invention provided inside the relay substrate 30. In addition, the vias 36, 37, which are the conductors of the present invention, includes any of the through holes, blind holes, embedded holes, etc.

within the scope of the present invention if it connects between different circuit layers.

Sixth Embodiment

The following describes a connector cable 600 of a sixth embodiment with reference to FIGS. 21 to 24.

The connector cable 600 of the sixth embodiment shown in FIGS. 21 to 24 is configured such that: there are prepared two connector cables 100 of the first embodiment described above; the two connector cables 100 are attached to each other at their bottom surfaces of the relay substrates 30; and the connector cable 100 on the back surface side and the connector cable 100 on the front surface side are arranged so as to be mirror image symmetric.

In other words, the connector cable 600 of the sixth embodiment is configured such that: the relay substrate 30 also has the GND conductor layer 32 provided on the back surface side; and the contact 11 of the connector 10, the shielded cable 20, and the GND conductor layer 32 are arranged on the back surface side and the front surface side so as to be mirror image symmetric. Also according to the connector cable 600 of the sixth embodiment having such an arrangement configuration, there can be provided a connector cable that prevent both increase in impedance and a short circuit.

Figure 25:
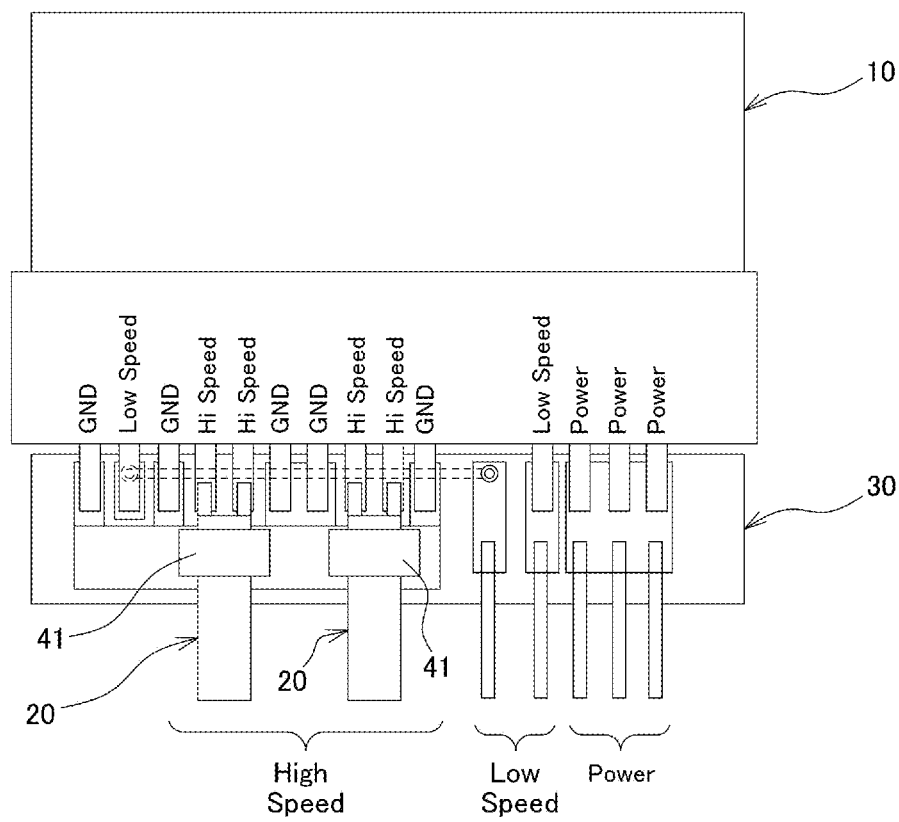
FIG. 25 is a diagram showing one specific example in various possible examples of the connector cable of the present invention.
Figure 26:
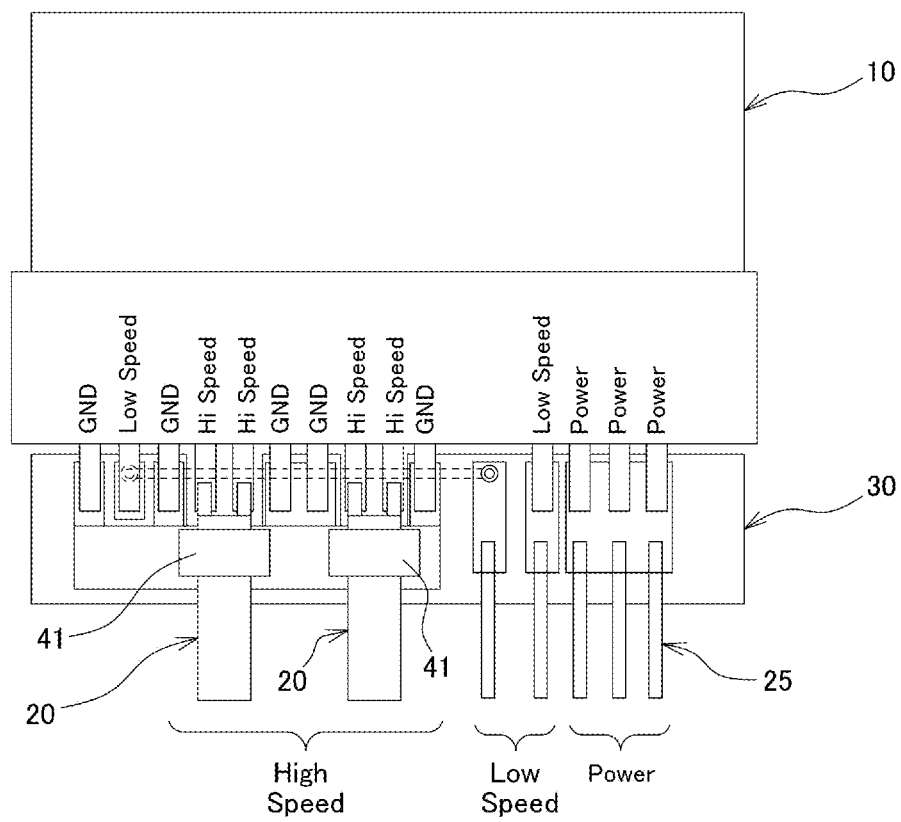
FIG. 26 is a diagram showing another specific example in various possible examples of the connector cable of the present invention.
Figure 27:
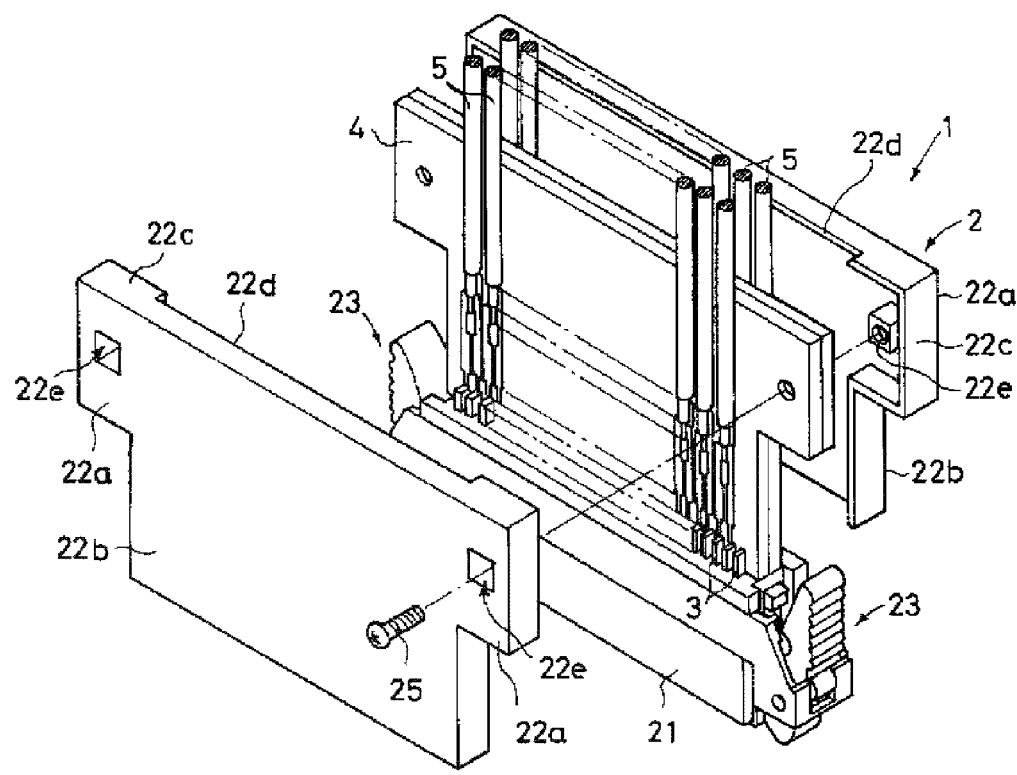
FIG. 27 is a perspective view showing an exploded state of a high-speed connector cable according to the invention of Japanese Patent Laid-Open No. 8-167457.
Figure 28:
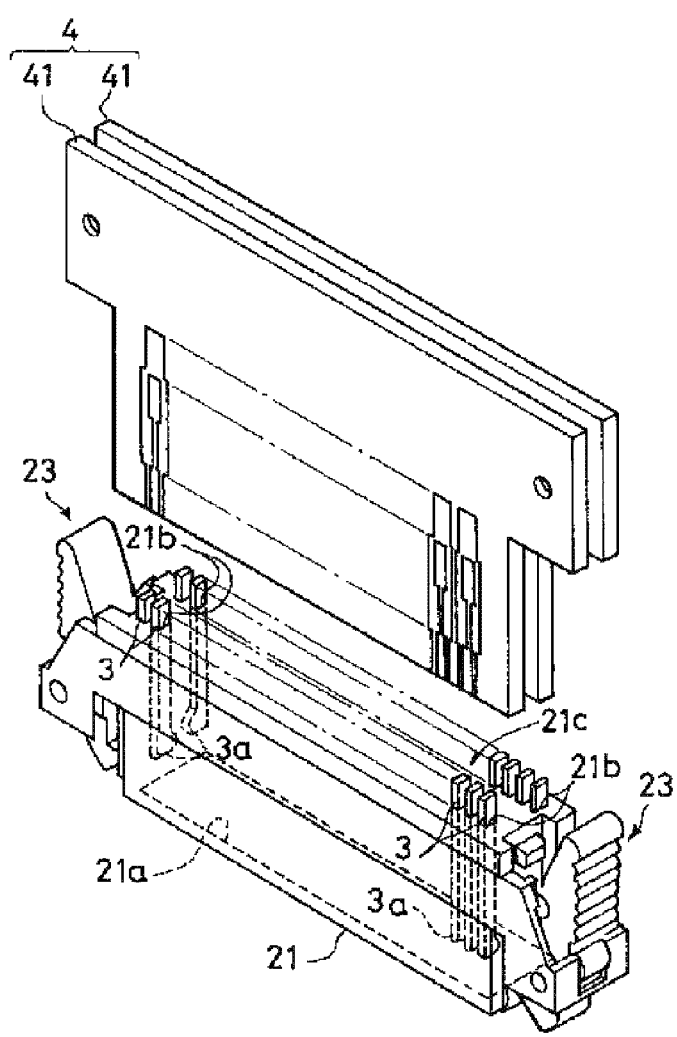
FIG. 28 is a perspective view showing a housing and a relay substrate configuring the high-speed connector cable according to the invention of Japanese Patent Laid-Open No. 8-167457.
Figure 29A:
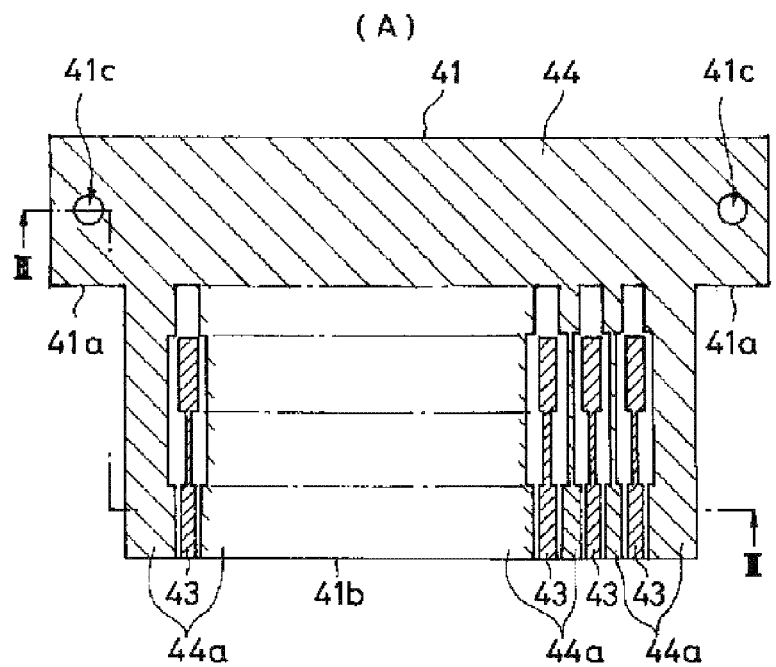
FIG. 29(A) is a front view singly showing a board configuring a relay substrate for a high-speed connector cable according to the invention of Japanese Patent Laid-Open No. 8-167457.
Figure 29B:
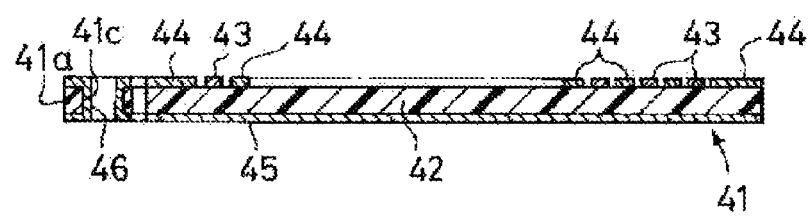
FIG. 29(B) is a cross-sectional view showing a cross section taken along line III-III in FIG. 29(A)
Figure 30:
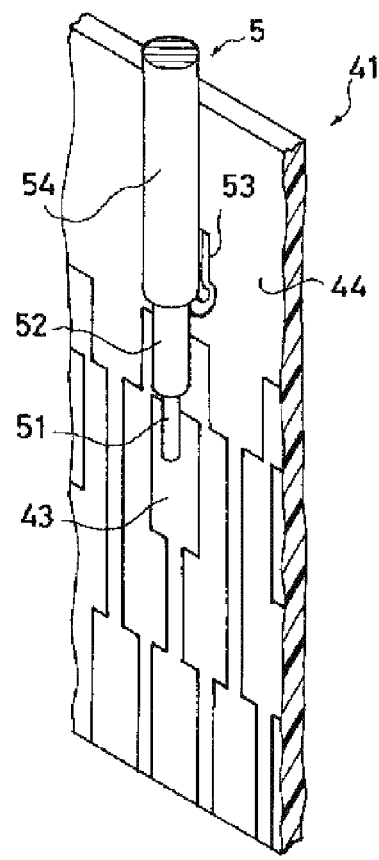
FIG. 30 is a perspective view showing a relay substrate and a coaxial cable for a high-speed connector cable according to the invention of Japanese Patent Laid-Open No. 8-167457.

With reference to FIGS. 1 to 24, the above has described various possible embodiments of the present invention including the connector cables 100, 200, 300, 400, 500, 600 of the first to sixth embodiments. Making various combinations of these embodiments can expand the scope of application of the connector cable of the present invention. Such specific examples are shown in FIGS. 25 and 26. Note that various electronic components may be mounted on the relay substrate of the present invention, and in such a case, the unshielded cable and the contact may be connected via the various electronic components.

EXAMPLE 1

The example shown in FIG. 25 is an example in which the connector cable 200 of the second embodiment and the connector cable 500 of the fifth embodiment are combined. The connector cable of this example allows easy cable routing if types of contacts 11 of the connector 10 are various and a plurality of types of contacts 11 are mixed. This can make the connector cable highly expandable. In addition, direct connection of the inner conductor 21 of the shielded cable 20 to the contact 111 for high-speed signals of the connector 10 can reduce transmission loss on the relay substrate 30. At the same time, making the relay substrate 30 smaller in the depth direction can bring about an effect of expanding the applicable range and reducing the cost.

EXAMPLE 2

The example shown in FIG. 26 is an example in which the connector cable 300 of the third embodiment and the connector cable 500 of the fifth embodiment are combined. The connector cable of this example can obtain the same effect as that of the example shown in FIG. 25. Additionally, if the contact 11 of the connector 10 is displaced in the vertical direction, for example, the substrate cut-out region 35 facilitates correcting the position of the contact 111 for high-speed signals and the inner conductor 21, which leads to an advantage of high degree of freedom in connection. Further, adjusting the shape of the contact 111 for high-speed signals and the substrate cut-out region 35 can adjust impedance matching.

INDUSTRIAL APPLICABILITY

The present invention relates to a connector cable in which a connector and a shielded cable are connected via a relay substrate, and is particularly useful for connector cables that transmit high-speed signals.

REFERENCE SIGNS LIST 100 connector cable (of the first embodiment)
200 connector cable (of the second embodiment)
300 connector cable (of the third embodiment)
400 connector cable (of the fourth embodiment)
500 connector cable (of the fifth embodiment)
600 connector cable (of the sixth embodiment)
10 connector
11 contact
14 connector mold
15 connector mold extension portion
111 contact for high-speed signals
112 contact for GND
113 contact for power supply (or for low-speed signals)
20 shielded cable
21 inner conductor
22 dielectric
23 shield member
25 unshielded cable
30 relay substrate
31 insulating member
32 GND conductor layer
321 GND cut-out region
33 substrate layer
34 GND conductor layer exposed portion
35 substrate cut-out region
36, 37 via (conductor)
38 substrate inner conductor (conductor)
41 solder

What is claimed is:

1. A connector cable comprising:
a connector;
a shielded cable; and
a relay substrate, the connector and the shielded cable being connected via the relay substrate,
wherein the shielded cable includes at least an inner conductor, a dielectric covering the inner conductor, and a shield member covering the dielectric,
the inner conductor includes a connection part at a part where the shield member and the dielectric are removed to expose the inner conductor, the connection part directly contacting a contact of the connector to be electrically connected to the connector,
the relay substrate includes a ground (GND) conductor layer on a front surface thereof, and at least directly under a part where the shield member is removed to expose the dielectric, the ground (GND) conductor layer is arranged, and
the GND conductor layer arranged directly under the part where the shield member is removed, is covered with an insulating member.

2. The connector cable according to claim 1, wherein the insulating member is a resist coated to a front surface of the GND conductor layer.

3. The connector cable according to claim 1, wherein
the connection part of the inner conductor of the shielded cable and the contact of the connector are connected by soldering, and
the relay substrate is cut out at a part directly under the contact of the connector and the connection part of the inner conductor of the shielded cable.

4. The connector cable according to claim 1, wherein
the connector includes an insulation connector mold to hold the contact,
the connection part of the inner conductor of the shielded cable and the contact of the connector are connected by soldering, and
the connector mold extends directly under the contact of the connector and the connection part of the inner conductor of the shielded cable.

5. The connector cable according to claim 4, wherein the insulation connector mold is arranged at a bottom portion of the connector, and the connection part of the inner conductor of the shielded cable and the contact of the connector are arranged on the insulation connector mold.

6. The connector cable according to claim 1, further comprising
at least one unshielded cable connected to the connector,
wherein the relay substrate includes a conductor, and the at least one unshielded cable is connected to the contact of the connector via the conductor of the relay substrate.

7. The connector cable according to claim 6, wherein the connector further includes another contact apart from the contact thereof, a first via arranged at a side of the another contact, and at least one second via arranged at a side of the at least one unshielded cable, and
the another contact is connected to the at least one unshielded cable through the first via, the second via, and the conductor.

8. The connector cable according to claim 1, further comprising:
another connector; and
another shielded cable,
wherein the relay substrate further includes another GND conductor layer on a back surface thereof, and
the another connector, the another shielded cable, and the another GND conductor layer are arranged so as to be mirror image symmetric with the connector, the shielded cable, and the GND conductor layer.

9. The connector cable according to claim 1, wherein the connection part of the inner conductor of the shielded cable is directly arranged on the contact of the connector without any intervening member to be contacted to each other.

10. The connector cable according to claim 9, wherein the connection part of the inner conductor of the shielded cable is only a part directly contacting the contact of the connector, and has a length shorter than that of the contact of the connector in a longitudinal direction thereof.

11. A connector cable comprising:
a connector;
a shielded cable; and
a relay substrate, the connector and the shielded cable being connected via the relay substrate,
wherein the shielded cable includes at least an inner conductor, a dielectric covering the inner conductor, and a shield member covering the dielectric,
the inner conductor includes a connection part at a part where the shield member and the dielectric are removed to expose the inner conductor, the connection part being connected to a contact of the connector, the relay substrate includes a ground (GND) conductor layer on a front surface thereof, and at least directly under a part where the shield member is removed to expose the dielectric, the ground (GND) conductor layer is arranged, the GND conductor layer arranged directly under the part where the shield member is removed, is covered with an insulating member, the connection part of the inner conductor of the shielded cable and the contact of the connector are connected by soldering, the GND conductor layer is extended to directly under the contact of the connector and the connection part of the inner conductor of the shielded cable, and the GND conductor layer directly under the connection part is cut out.

* * * * *